United States Patent
Golding et al.

(10) Patent No.: US 7,060,130 B2
(45) Date of Patent: Jun. 13, 2006

(54) HETEROEPITAXIAL DIAMOND AND DIAMOND NUCLEI PRECURSORS

(75) Inventors: Brage Golding, DeWitt, MI (US); Connie Bednarski-Meinke, Syracuse, NY (US); Zhong-ning Dai, East Lansing, MI (US)

(73) Assignee: Board of Trustees of Michigan State University, East Lansing, MI (US)

( * ) Notice: Subject to any disclaimer, the term of this patent is extended or adjusted under 35 U.S.C. 154(b) by 180 days.

(21) Appl. No.: 10/634,908

(22) Filed: Aug. 5, 2003

(65) Prior Publication Data

US 2004/0069209 A1 Apr. 15, 2004

Related U.S. Application Data

(60) Provisional application No. 60/406,150, filed on Aug. 27, 2002.

(51) Int. Cl.
C30B 11/00 (2006.01)
(52) U.S. Cl. .............................. 117/75; 117/79; 117/92
(58) Field of Classification Search ................. 117/75, 117/79, 92, 95
See application file for complete search history.

(56) References Cited

U.S. PATENT DOCUMENTS

| | | |
|---|---|---|
| 5,397,428 A | 3/1995 | Stoner et al. |
| 5,587,210 A | 12/1996 | Marchywka et al. |
| 5,743,957 A | 4/1998 | Kobashi |
| 5,863,324 A | 1/1999 | Kobashi et al. |
| 5,891,575 A | 4/1999 | Marchywka et al. |
| 5,993,919 A | 11/1999 | Tsuno et al. |
| 6,032,611 A | 3/2000 | Asakawa et al. |
| 6,063,187 A | 5/2000 | Lee et al. |
| 6,080,378 A | 6/2000 | Yokota et al. |
| 6,096,129 A | 8/2000 | Saito et al. |
| 6,383,288 B1 | 5/2002 | Hayashi et al. |

OTHER PUBLICATIONS

Yugo, S., et al., Appl. Phys. Lett. 58, 1036 (1991).
Loloee, R., et al., Phil. Mag. A 81, 261 (2001).
Wolfing, B., et al., J. Phys: Condensed Matter 11, 2669 (1990).
Vargas, R., et al., Appl. Phys. Lett. 65, 1094 (1994).
Kronberg, M.L., Acta Metall. 5, 507 (1957).
Kuo, K.P., et al., Diamond and Related Materials 6, 1097 (1997).

(Continued)

*Primary Examiner*—Felisa Hiteshew
(74) *Attorney, Agent, or Firm*—Ian C. McLeod

(57) ABSTRACT

A process for growing by chemical vapor deposition a heteroepitaxial single crystal diamond is disclosed. The process provides a substrate which enables the growth of single crystal diamond which is vapor coated on an iridium film. An intermediate process for producing a composite composition with diamond nuclei is also described. Further described are composite compositions of metal oxide, iridium and single crystal diamond films or diamond nuclei. Single crystal diamond is useful in a variety of electronics and acoustics fields.

13 Claims, 23 Drawing Sheets

OTHER PUBLICATIONS

Kulisch, W., et al., Physica Status Solidi A 154, 155 (1996).
Whitfield, M.D., et al., Diamond and Related Material 9, 305 (2000).
Ohtuska, K., et al., Jpn. J. Appl. Phys. 36, 1214 (1997).
Schreck, M., et al., Appl. Phys. Lett. 74, 650 (1999).
Tsubota, T., et al., Diamond and Related Materials 9, 1380 (2000).
Hormann, et al., Diamond and Related Materials 9, 256 (2000).
Dai, Z., et al., Proc. Mat. Res. Soc., P11.35, 684 (2001).
Wolter, S., et al., Appl. Phys. Lett. 62, 1215 (1993).
Jiang, X., Diamond and Related Materials 2, 1112 (1993).
Wild, C., et al., Diamond and Related Materials 3, 373 (1994).
Ohtsuka, K., et al., Jpn. J. Appl. Phys. Pt. 2, 35 (1996) L1072.
Schreck, M., et al., Appl. Phys. Lett. 78, 192 (2001).

|←— 100 nm —→|

|←—2 μm—→|

11. Quartz dome
12. Plasma discharge
13. Secondary discharge
14. Isolated stage
15. Quartz isolation ring
16. Grounded stage
17. Alumina peg
18. Alumina washer
19. Silicon mask
20. Bias ring and supports
21. Molybdenum sample holder
22. Vacuum chamber baseplate
23. Quartz tubing to isolate bias ring supports Example of a sheet from the diamond database. A sheet is generated for each experiment of diamond growth. This experiment was carried out on 31 August 2000, and represents the growth of a 25 μm thick diamond film in 36 hours.

| SAMPLE ID: | 32 |
|---|---|
| DATE: | 31-Aug-00 |
| CVD operator: | |

Precondition
| Ion Gauge (torr): | 3.2 E-06 |
|---|---|
| RGA (torr): | |
| PP(H₂O): | |
| PP(N₂): | |
| PP(O₂): | |
| Start time: | |
| RM temp (°C): | 25 |
| Rel. Hum (%): | 60 |

Geometry:
Cap #ID:
Cap Size:
Geometry:
Post #:
Bias Ring #:
Ring Height(mm): 32
Si mask#ID:

Sample:
Substrate ID: 0818#3
Substrate type:
Sample location:

Notes/Comments:
Notebook #
Page #
Comment: v. slow cool

Relation ID:

INDEX

Input parameters

| | carburization | bias | growth 1 | growth 2 |
|---|---|---|---|---|
| MW POWER | 1500 | 1500 | 1500 | 1500 |
| MW % of full | 14 | 14 | 14 | 14 |
| GAS FLOW | | | | |
| H₂ | 300 | 300 | 300 | 300 |
| CH₄ | 6 | 6 | 3 | 3 |
| Other (ppm) | | | | |
| TIME | | 60 | 90 | 2070 |
| PRESSURE | 18 | 18 | 18 | 28 |
| BIAS VOLTS | | | | |
| I MEAN | | 40.0 | | |
| TEMP AVG | | 693 | 625 | 730 |
| TC AVG | | 491 | 535 | 536 |

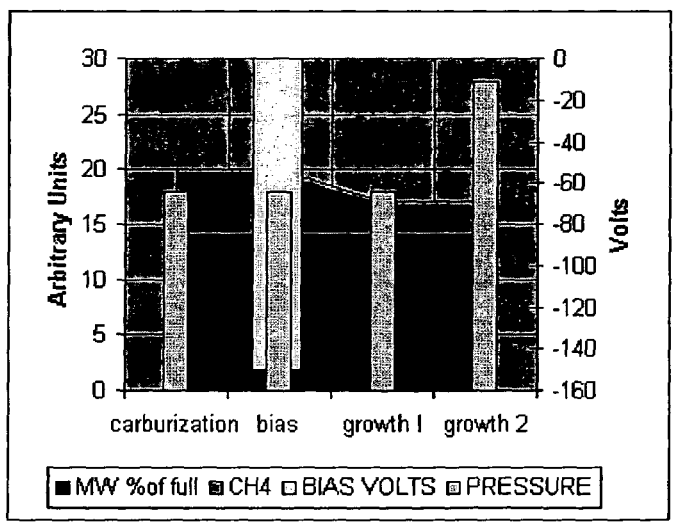

FIGURE 15

Second part of the database page. The graph shows the time-dependent temperature and bias current.

Images
Origin Data 1 mm

SAMPLE ID: 225
DATE: 10-Apr-02
CVD operator:

Pr_condition
Ion Gauge (torr): 4.5E-07
RGA (torr): 1.2E-06
PP($H_2O$): 5.00E-10
PP($N_2$): 1.00E-10
PP($O_2$): 1.00E-10
Start time: 9:00:00 AM
RM temp (°C): 22
Rel. Hum: 30

Geometry:
Cap #ID: 9
Cap Size:
Geometry: round
Post #: 7
Bias Ring #: 4
Ring Height (mm): 32
Si mask #ID: 11

Sample:
Substrate ID: 04052002#60
Substrate type: Ir/a-AL0
Sample location:

N tes/Comments:
Notebook #:
Page #:
Comment: three hr run

Relation ID:

INDEX

Input parameters

| | carburization | bias | growth 1 | growth 2 |
|---|---|---|---|---|
| MW POWER | 1500 | 1500 | 1500 | 1500 |
| MW %of full | 14 | 14 | 14 | 14 |
| GAS FLOW | | | | |
| $H_2$ | 300 | 300 | 300 | |
| $CH_4$ | 6 | 6 | 3 | |
| Other (ppm) | | | | |
| TIME | 12 | 60 | 180 | |
| PRESSURE | 18 | 18 | 18 | |
| BIAS VOLTS | | | | |
| I MEAN | | 39.0 | | |
| TEMP AVG | | 699 | 629 | |
| TC AVG | | 471 | 470 | |

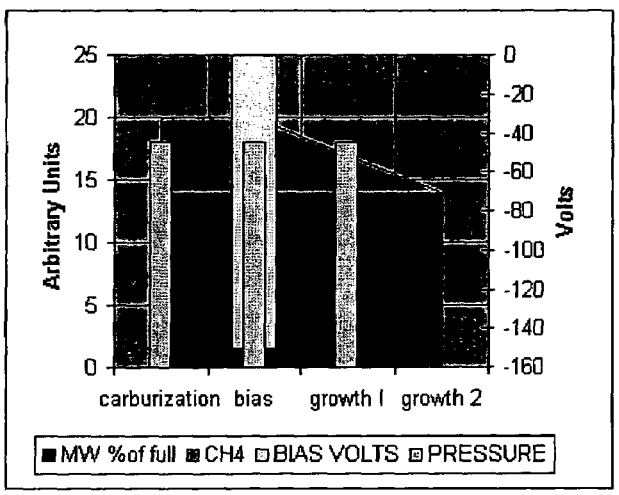

FIGURE 20

HETEROEPITAXIAL DIAMOND AND DIAMOND NUCLEI PRECURSORS

CROSS REFERENCE TO RELATES APPLICATION

This application relies for priority on U.S. provisional application Ser. No. 60/406,150, filed Aug. 27, 2002.

GOVERNMENT RIGHTS

This invention was funded by National Science Foundation Grant DMR 9809688. The U.S. government has certain rights to this invention.

BACKGROUND OF THE INVENTION (1) Field of the Invention

The present invention relates to a process for growing heteroepitaxial single crystal diamond and diamond crystallite precursors. In particular, the present invention uses a surface on a metal oxide substrate coated with a thin film of iridium which enables growing the single crystal diamond or the diamond nuclei as precursors.

(2) Description of Related Art

FCC (face-centered cubic) Ir buffer layers have been used as substrates for single crystal diamond film growth by low pressure chemical vapor deposition (CVD). MgO and $SrTiO_3$ were used as substrates for (001) Ir films (Ohtsuka, K., et al., Jpn. J. Appl. Phys. 36, 1214 (1997); Schreck, M., et al., Appl. Phys. Lett. 74 650 (1999); and Tsubota, T., et al., Diamond and Related Materials 9 1380 (2000)). Cubic MgO (Ohtsuka, K., et al., Jpn. J. Appl. Phys. 36, 1214 (1997); and Tsubota, T., et al., Diamond and Related Materials 9 1380 (2000)) and $SrTiO_3$ (Schreck, H., et al., Appl. Phys. Lett. 74 650 (1999); Hörmann, et al., Diamond and Related Materials 9 256 (2000); and Dai, Z., et al., Proc. Mat. Res. Soc., P11.35, 684 (2001)).

Heteroepitaxial growth of advanced electronic materials depends on the development of suitable, relatively low-cost, lattice-matched substrate systems. Initial attempts toward heteroepitaxy of diamond were made with growth of highly-oriented crystallites of diamond on silicon, despite the existence of a large lattice parameter mismatch (Walter, S., et al. Appl. Phys. Lett. 62 1215 (1993); Jiang, X, Diamond and Related Materials 2 1112 (1993); and Wild, C., et al., Diamond and Related Materials 3 373 (1994)). It was later found that films of Ir, grown as a buffer layer on MgO, could serve as a substrate for the nucleation and growth of CVD diamond (Ohtsuka, K., et al., Jpn. J. Appl. Phys. Pt. 2 35 (1996) L1072); Ohtsuka, K., et al., Jpn. J. Appl. Phys. Pt. 2 36 (1997) L1214; and Tsubota, T., et al., Diamond and Related Materials 9 1380 (2000)). With a lattice parameter 7% larger than diamond, Ir appears to have sufficient long-term chemical and physical stability in the high-temperature environment of a hydrogen plasma. The use of $SrTiO_3$ as a replacement for MgO has also proven useful in decreasing the mosaic spread of the epitaxial Ir and the resultant heteroepitaxial diamond (Schreck, M., et al., Appl. Phys. Lett. 74 650 (1999); and Schreck, M., et al., Appl. Phys. Lett. 78 192 (2001)).

In parallel with heteroepitaxial growth efforts, the conditions for achieving high diamond nucleation densities on various substrates have been extensively examined. The bias-enhanced nucleation process (Yugo, S., et al., Appl. Phys. Lett. 58 1036 (1991)), in which a negative voltage applied to the substrate results in its bombardment by relatively low-energy positive ions extracted from the plasma, is a key step for inducing the formation of diamond nuclei. It is important that the nuclei adopt the underlying orientation of the substrate and that their density be maximized so as to lead to rapid coalescence of crystallites during the early stages of growth. Although the conditions that lead to effective nucleation are well known in principle, there is little agreement on the physical mechanisms that underpin the process. The process is also system-specific to some degree, depending on details of reactor geometry and a multitude of processing parameters.

Single crystal diamond is particularly useful in the electronics and acoustics fields. U.S. Pat. No. 5,397,428 to Stoner et al; U.S. Pat. No. 5,587,210 to Marchywka et al; U.S. Pat. No. 5,743,957 to Kobashi; U.S. Pat. No. 5,863,324 to Kobashi et al; U.S. Pat. No. 5,891,575 to Marchywka et al; U.S. Pat. No. 5,993,919 to Tsuno et al; U.S. Pat. No. 6,032,611 to Asakawa et al; U.S. Pat. No. 6,063,187 to Lee et al; U.S. Pat. No. 6,080,378 to Yokota et al; U.S. Pat. No. 6,096,129 to Saito et al; and U.S. Pat. No. 6,383,288 to Hayashi et al; are relevant to the present invention and form part of the background for the invention. The disclosure of U.S. Pat. No. 5,397,428 to Stoner et al and U.S. Pat. No. 5,993,919 to Tsuno et al is incorporated by reference for its general disclosure.

SUMMARY OF INVENTION

The present invention relates to a process for producing heteroepitaxial growth of a single crystal diamond film which comprises:

(a) forming an atomically flat stepped surface on a single crystal metal oxide substrate which has a crystal structure compatible with growing epitaxial single crystal diamond;

(b) depositing a film of epitaxial iridium metal on the oxide so that a (001) surface results;

(c) depositing by chemical vapor deposition (CVD) diamond nuclei onto the iridium film on the substrate from a plasma produced from a mixture comprising methane and hydrogen gases with dc-biased ion bombardment onto the iridium film from the gases; and (d) growing the diamond film on the diamond nuclei and iridium film using CVD and the mixture of the methane and the hydrogen, without the dc-biased ion bombardment to form the single crystal diamond.

The metal oxide substrate is preferably selected from the group consisting of sapphire, strontium titanate, lanthanum aluminate and magnesium oxide. Preferably the atomically flat surface is provided by chemical, mechanical or thermal means. Preferably the d.c.-based ion bombardment is between −100 and −300 volts relative to a bias ring located within the plasma above the substrate. Preferably the microwave frequency is between 900 MHz and 2.5 GHz, the methane to hydrogen ratio is between 0.001 and 0.04 by volume, and the temperature of the iridium on the substrate is between about 650 and 850° C. Preferably the substrate is electrically isolated during the CVD. Preferably the gases do not contain nitrogen.

Further the present invention relates to a process for producing a composite composition which comprises:

(a) forming atomically flat stepped surface on a single crystal metal oxide which has a crystal structure suitable for depositing a film of epitaxial iridium to produce a (001) film on the surface;

(b) depositing the film of epitaxial iridium metal on the surface so that the (001) surface results; and (c) depositing single crystal diamond nuclei on the iridium film by chemical vapor deposition (CVD) from a plasma produced from a mixture comprising methane and hydrogen gases with dc-biased ion bombardment onto the iridium film from the gases to produce the composite composition.

As used herein, the term "single crystal diamond nuclei" means diamond particles on a nanometer scale which are about the same diameter and generally about 3 to 7 nm in size. The nuclei form in a dense array upon removal of the DC bias and assume the same predominant orientation as the Ir layer.

The substrate is sapphire; the dc bias is between −100 and −300 volts relative to a bias ring located in the plasma above the surface; the microwave frequency is between 900 MHz and 2.5 GHz, the methane to hydrogen ratio is between 0.001 and 0.04 and the temperature is between 650 and 850° C.; the substrate is electrically isolated during the CVD; the gases are essentially free of nitrogen.

The present invention also relates to a composite composition which comprises:

(a) an atomically flat stepped surface single crystal metal oxide substrate;

(b) a (001) film of epitaxial iridium deposited on the substrate; and (c) an epitaxial single crystal diamond (001) film deposited on the iridium film.

The metal oxide is sapphire.

The present invention also relates to a composite composition which comprises:

(a) an atomically flat step surface single crystal metal oxide substrate;

(b) a (001) film of epitaxial iridium deposited on the substrate; and (c) closely spaced, diamond nuclei deposited on the iridium to produce the composite composition.

The metal oxide is sapphire.

BRIEF DESCRIPTION OF DRAWINGS

FIG. 2 (inset) shows the Ir (200) rocking curve for the film. The Ir was deposited at 900° C. at a thickness of 300 nm.

FIGS. 7A and 7B: SEM micrographs. Lower panels

FIG. 8A substrate center; FIG. 8B substrate edge. Note the slightly incomplete coalescence at the substrate edge in FIG. 8B. The bright spots correspond to enhanced electron emission from small, easily charged diamond topographic features.

In FIG. 9A is a perspective view showing the bias ring 20 schematically. FIG. 9B shows a detailed cross-section of the apparatus 10.

FIG. 15 shows a spreadsheet entry for STO/Ir/diamond growth experiment. A sheet is generated for each experiment in which diamond growth is attempted. The experiment was carried out on Aug. 31, 2000, and represents the growth of a 25 μm thick diamond film in 36 hours.

FIG. 20 shows spreadsheet entry for ALO/Ir/diamond growth experiment.

DESCRIPTION OF PREFERRED EMBODIMENTS

Figure 9A:
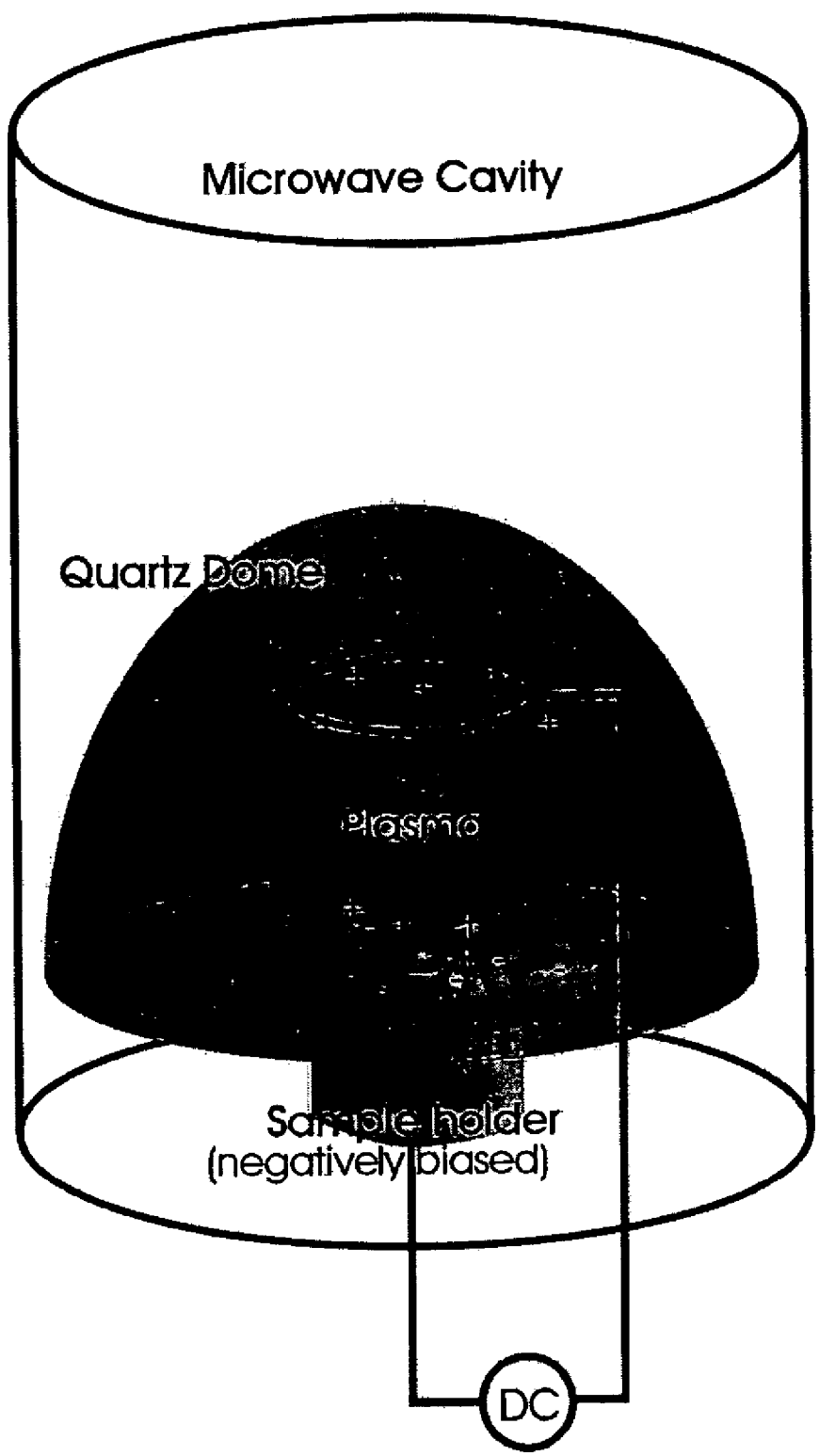
FIGS. 9A and 9B show part of the chemical vapor deposition apparatus 10 and sample bias arrangement.
Figure 9B:
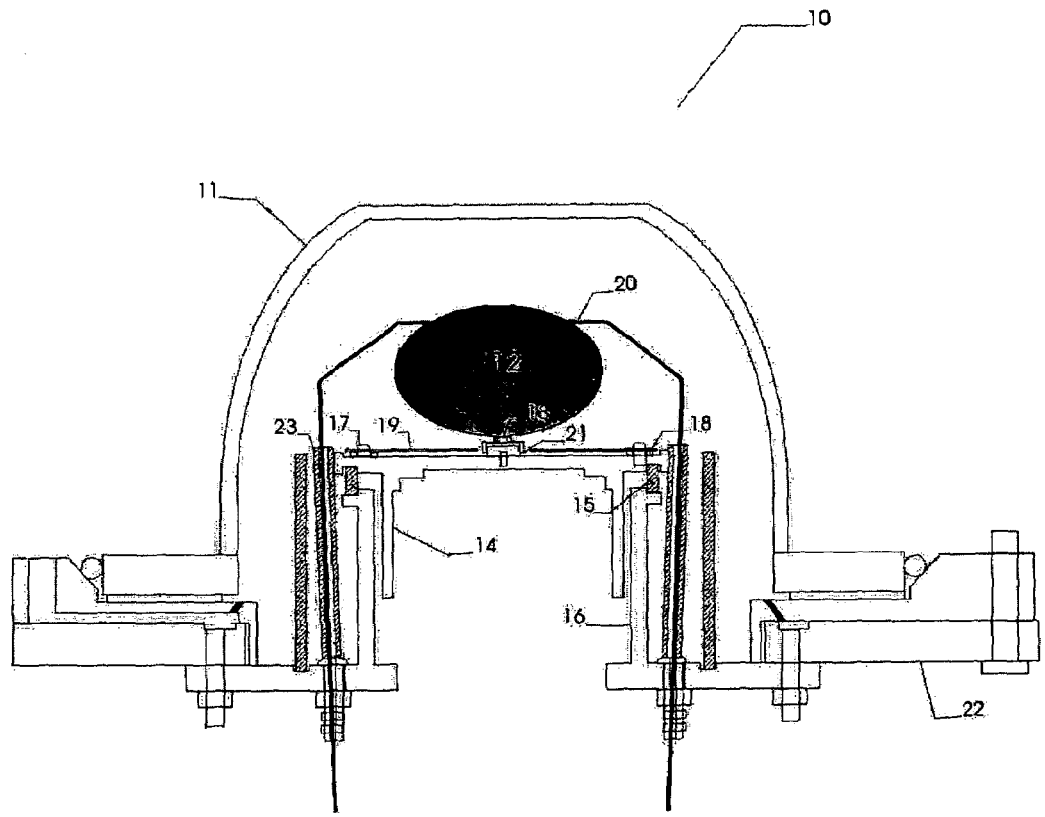
Figure 10:
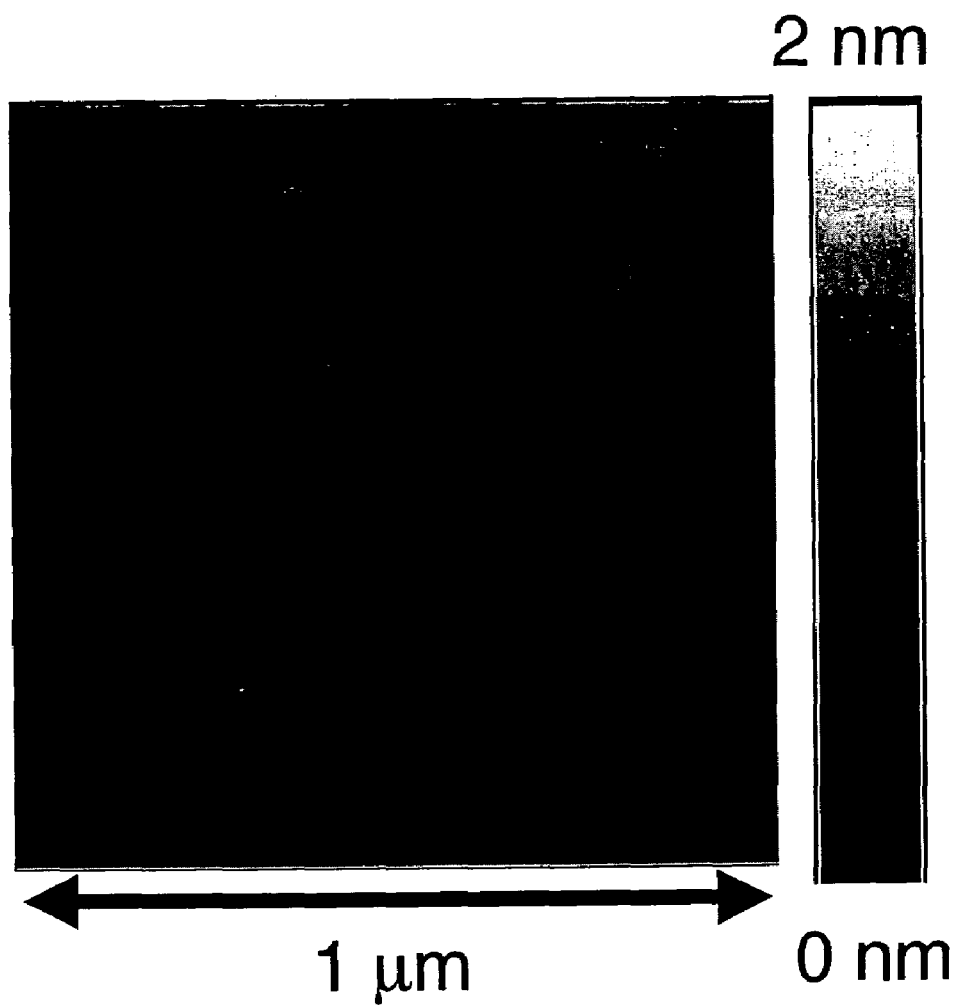
FIG. 10 shows epitaxial iridium characterization. Atomic force microscope image of 150 nm Ir on STO. Each contour line represents a single atomic step of the epitaxial Ir film. Each terrace is atomically flat.

FIGS. 9A and 9B show the apparatus used in the present invention. In this apparatus the following elements are present:
11—Quartz dome
12—Plasma discharge
13—Secondary discharge
14—Isolated stage
15—Quartz isolation ring
16—Grounded stage
17—Alumina peg
18—Alumina washer
19—Silicon mask
20—Bias ring and supports
21—Molybdenum sample holder
22—Vacuum chamber baseplate
23—quartz tubing to isolate bias ring supports Described here are improvements in the growth of single crystal diamond by low-pressure microwave plasma-enhanced CVD. Oxide substrates with flat, low-index surfaces form the initial basis for the process. Iridium was deposited on heated substrates in a UHV electron-beam evaporation system resulting in epitaxial films, typically 150 to 300 nm thick, with Ir (100) parallel to the surface of all substrates as confirmed by X-ray and electron backscattering diffraction. Following Ir deposition, the samples were transferred to the CVD reactor 10 where a bias-enhanced nucleation step induced a dense condensate that completely covered the Ir surface. Uniform nucleation densities of order $10^{12}$ cm$^{-2}$ were observed. Interrupted growth studies, carried out at intervals from seconds to minutes subsequent to terminating the nucleation step, revealed a rapid coalescence of grains. One hour of growth resulted in a smooth, nearly featureless, (001) diamond-film. For extended growth runs, slabs of diamond were grown with thickness as great as 38 μm and lateral dimensions near 4 mm. The crystals were transparent in visible light and cleaved on (111) planes along <110> directions, similar to natural diamond.

Of particular significance is the successful use of sapphire as an underlying substrate. Its high crystalline perfection results in epitaxial Ir films with X-ray linewidths comparable to those grown on $SrTiO_3$. However, $Al_2O_3$ possesses superior interfacial stability at high temperatures in vacuum or in a hydrogen plasma with a better thermal expansivity match to diamond. Since sapphire is available as relatively inexpensive large diameter substrates, these results suggest that wafer-scale growth of heteroepitaxial diamond is feasible.

In the following Example 1 the growth morphology and orientation of single crystal (001) Ir films grown on a-plane sapphire by UHV electron-beam evaporation. The stability of (001) Ir on a low-symmetry sapphire plane is somewhat counterintuitive. Since sapphire has a stable surface structure and is available in large area wafers, this technology can enable low cost, large-area growth of heteroepitaxial diamond. Large-scale heteroepitaxial growth of diamond depends critically on the development of a suitable lattice-matched buffer layer and substrate system. Epitaxial (100) iridium films have been grown on terraced vicinal a-plane (11-20) $\alpha$-$Al_2O_3$ (sapphire) by electron-beam evaporation. The epitaxial relationship, Ir(100)//$Al_2O_3$ (11-20) with Ir[011]//$Al_2O_3$[1-100], was determined by X-ray diffraction and electron backscattering diffraction analysis. For a 300 nm thickness of Ir, a (200) rocking curve yielded a linewidth of 0.21°, and the film exhibited a macro-stepped surface with low pinhole density. This Ir/sapphire system provides a basis for large-area growth of (001) heteroepitaxial diamond.

EXAMPLE 1

Single crystal (11-20), or a-plane, sapphire substrates with dimensions 5×5×0.5 mm$^3$ were used for epitaxial Ir deposition. The substrates were annealed in a tube furnace to prepare an atomically flat surface. The annealed substrates were then loaded into a UHV chamber, base pressure $10^{-10}$ Torr, via a load-lock and Ir deposition performed by electron-beam evaporation from Ir rods of 99.9% purity. The sapphire substrates were placed in the UHV chamber, heated to 900° C. to 950° C., and Ir deposited at a rate of 2.4 nm/min. The substrate heater was switched off immediately after evaporation and the film allowed to cool to room temperature. After removal from the chamber, the film orientation and crystalline quality were examined by X-ray diffraction (XRD) using CuK$_\alpha$ radiation, and the Gaussian full width at half maximum (FWHM) extracted by a least-squares fit. Film crystallinity and the epitaxial relationship were characterized by EBSD (Electron Backscattering Diffraction) (Loloee, R., et al., Phil. Mag. A 81 261 (2001)). Surface morphology was examined with a field emission SEM (FESEM) and atomic force microscopy (AFM).

Figure 1A:
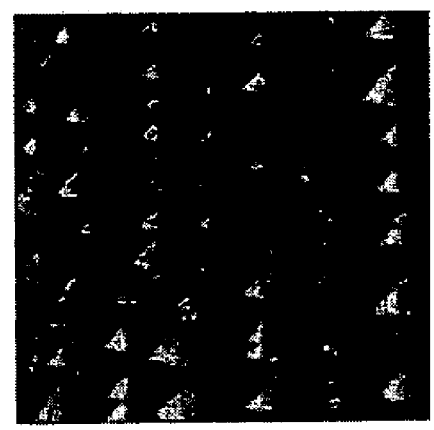
FIG. 1A is an AFM micrograph showing vicinal a-plane sapphire surface after annealing in air at 1450° C. for 16 hours.
Figure 1B:
FIGS. 1B–1F are AFM images of Ir films with thicknesses 2 nm, 20 nm, 40 nm, 80 nm, and 300 nm, respectively, evaporated at 900° C. to 950° C. under identical conditions onto a-plane sapphire. Scan dimensions: 1 μm×1 μm.
Figure 1C:
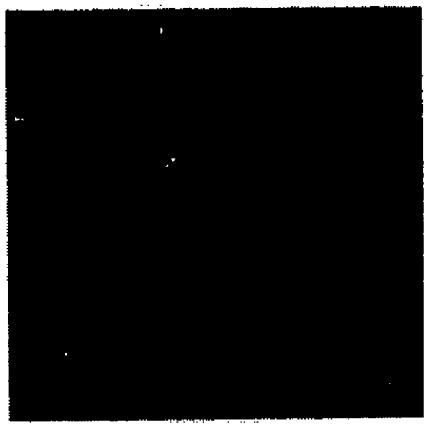
Figure 1D:
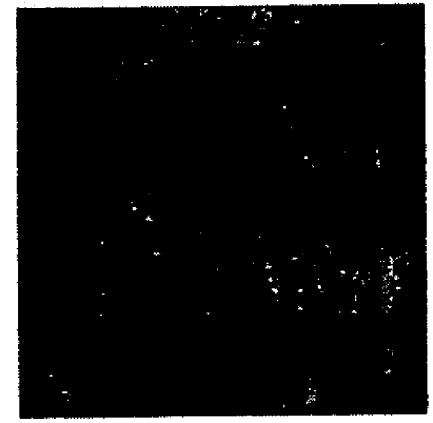
Figure 1E:
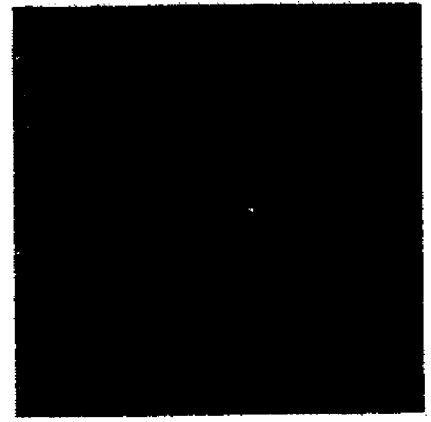
Figure 1F:
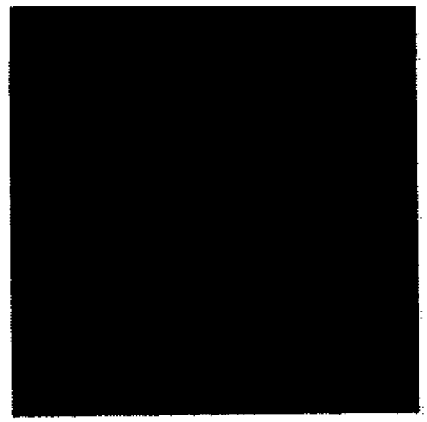

Before annealing, the substrates were inspected for growth defects by optical microscopy. They were then ultrasonically cleaned in acetone and methanol, and dried in flowing $N_2$. The substrates were also inspected by AFM for any micro-scale defects. To prepare terraced surfaces, we investigated annealing processes in air in a tube furnace for temperatures ranging from 1000 to 1450° C., for different annealing times and for various temperature ramp rates. It was found that terraced surfaces with single or multiple atomic steps could be prepared by annealing at 1450° C. for 15 hours. An initial ramp-up of the temperatures, at a rate of 2000° C./h, proved optimal. FIG. 1A shows a typical AFM surface of an a-plane sapphire substrate after annealing under these conditions. The steps have characteristic saw-tooth-shaped edges. The step height is 0.2 nm, corresponding to the height of two adjacent $O^{2-}$ layers. The mean surface roughness is 0.6 nm over an area of 1 μm$^2$. It was found that the surface morphology depends on miscut orientation, angle, and annealing process. Different miscut and polishing processes led to steps with differently shaped edges after annealing. This is consistent with prior work on Nb (100) growth on a-plane sapphire (Wölfing, B., et al., J. Phys: Condensed Matter 11 2669 (1999)).

Ir films with different thicknesses were prepared under the same conditions to study the evolution of film morphology and crystallinity with film thickness. All films were deposited at 900° C. to 950° C. at an evaporation rate of 2.4 nm/min. FIGS. 1B to 1F show AFM images of Ir films with thicknesses 2 nm, 20 nm, 40 nm, 80 nm, and 300 nm, respectively. Small islands form at the initial stages of deposition, coarsen as the film thickness increases, and eventually become a continuous film. The Ir film starts to coalesce at a thickness of 20 nm, with incomplete coalescence at 20 to 80 nm evidenced by pinholes. After coalescence, the film appears to grow in a 2D layer-by-layer mode.

Figure 2:
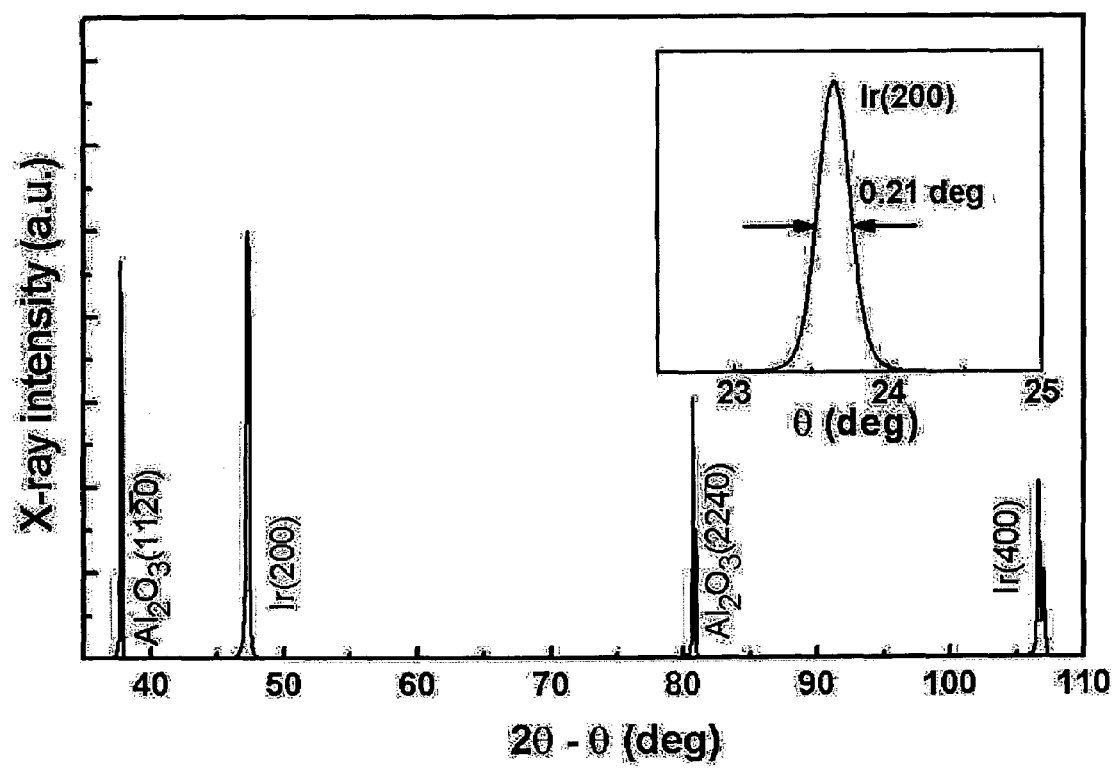
FIG. 2 is a XRD θ-2θ scan showing Ir film and a-plane sapphire substrate reflections.

FIG. 2 shows a wide-angle XRD θ-2θ scan of a 300 nm thick iridium film deposited at 800° C. on a-plane sapphire. FIG. 2 (inset) shows the Ir (200) rocking curve. It is seen that only the (100) orientation appears in the θ-2θ scan, indicating a highly-oriented (100) Ir film with its (100) plane parallel to sapphire (1120). FIG. 2 inset shows that the iridium film has a relatively narrow XRD linewidth of 0.21°, comparable to iridium growth (Schreck, M., et al., Appl. Phys. Lett. 74 650 (1999) on $SrTiO_3$ (0.17°).

Figure 3:
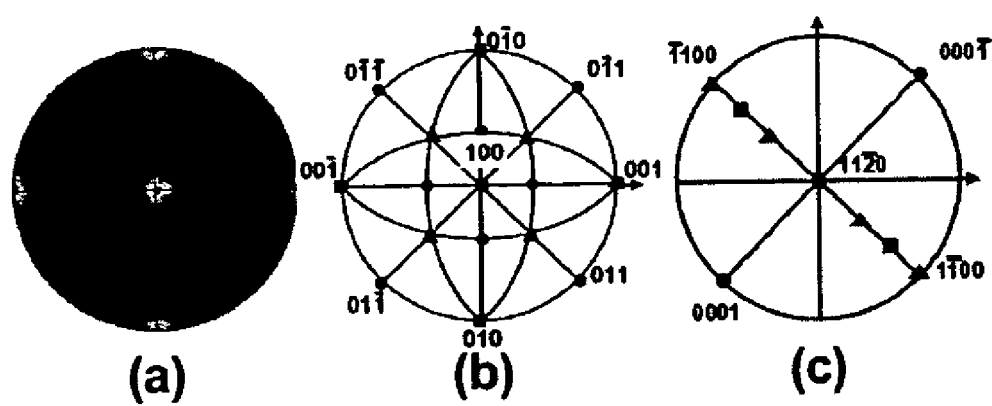
FIG. 3A is a (100) pole figure resulting from EBSD analysis of a 150 nm thick Ir film evaporated at 900° C.
FIG. 3B is a stereographic projection of (100) Ir.
FIG. 3C is a stereographic projection of a-plane sapphire.

EBSD was used to determine th Ir growth direction and in-plane orientation. The orientation analysis was carried out on a 150 nm thick Ir film grown with the resulting pole figure shown in FIG. 3A. The EBSD data were collected by sampling different locations on the Ir film and the resulting pole figures show that the Ir film maintains the same orientation across the entire sample. The well-defined pole figure indicates an unambiguous epitaxial relationship. The orientation relationship between the Ir film and the a-plane sapphire substrate was determined, and can be visualized by use of the stereographic projections of both materials shown in FIGS. 3B and 3C. The epitaxial relationship between Ir and sapphire is (100)Ir//(11-20) $Al_2O_3$ with [011]Ir//[1-100] $Al_2O_3$ and Ir [011]//$Al_2O_3$[0001]. This agrees with previous work on Ir deposited from metalorganic precursors at lower temperatures (Vargas, R., et al., Appl. Phys. Lett. 65 1094 (1994)).

Figure 4:
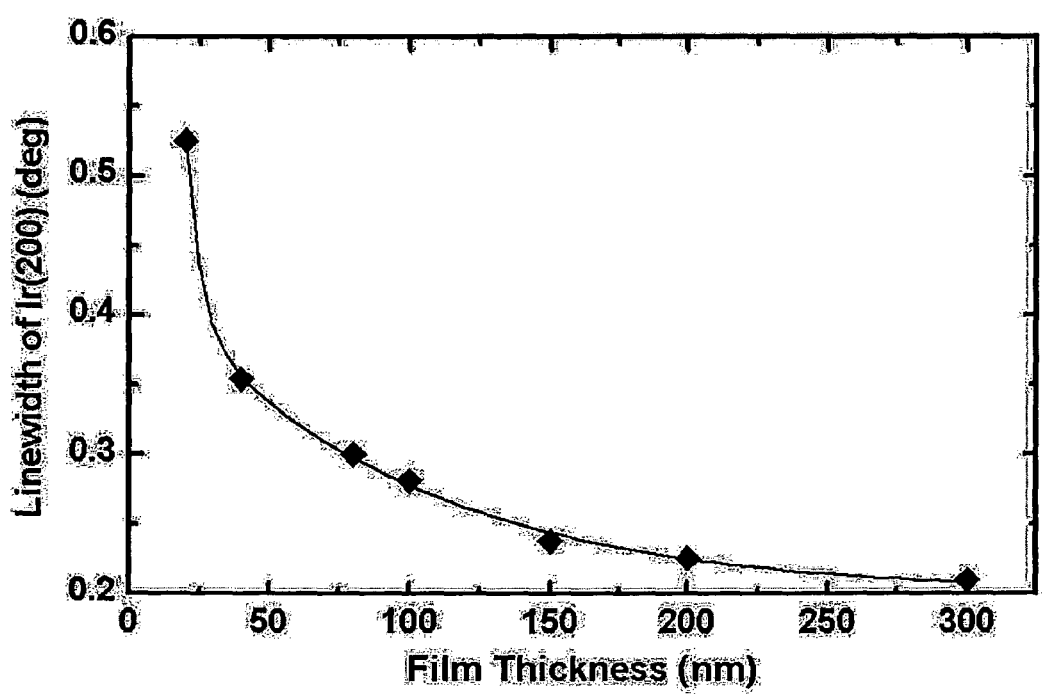
FIG. 4 is a graph showing film thickness dependence of the Ir (200) rocking curve linewidth for Ir films deposited at 900° C. on a-plane sapphire.

FIG. 4 shows the dependence of XRD linewidth on Ir film thickness. Film perfection increases as the thickness increases, as indicated by the narrowing of the Ir(200) linewidth. However, it was noted that there were weak (111) reflections for some thin films, although films thicker than 150 nm have essentially no (111) grains. This suggests that (111) grains may exist in the thin interface layer adjacent to the sapphire substrate. As the film thickness increases, the perfection of the (100) Ir film increases, possibly by overgrowth of the disoriented grains.

Films were also prepared at different substrate temperatures to study the evolution of surface morphology and crystalline quality. XRD analysis showed that a film grown at 600° C. is completely (111) oriented, whereas films grown at 700° and 750° C. show more (100) orientation, while the films grown at 900° C. or above are almost completely (100) oriented.

Epitaxy of Ir on a-plane sapphire is not as obvious as on cubic substrates, because of the lower symmetry of sapphire. Sapphire has a hexagonal structure and belongs to the space group R 3 c with lattice constants a=0.476 nm, c=1.299 nm. Ir is FCC, with lattice constant a=0.384 nm. The structure of sapphire can be visualized as $O^{2-}$ anions in an approximately hexagonal-close-packed arrangement, with two-thirds of the octahedral voids occupied by $Al^{3+}$ cations (Kronberg, M. L., Acta Metall. 5 507 (1975)). The oxygen row distances on the O-terminated a-plane surface are 0.433 nm along [001]. Along [1-100] there are three staggered $O^{2-}$ anions in the unit cell with mean spacing 0.275 nm. For (100) Ir films, the in-plane orientation relationship is (100) Ir//(11-20)$Al_2O_3$ with [011]Ir//[1-100]$Al_2O_3$ and [011 ]Ir//[001]$Al_2O_3$. There is a 1.2% mismatch along the [011]//[1-100] direction, but the mismatch along the [011[//[0001] direction is large. However, strain can be reduced along the [011]//[0001] direction if registration occurs with a 3:2 ratio of nearest-neighbor Ir to oxygen row distance, with a net mismatch of 11%, or with a 5:3 ratio for a net mismatch of 4.5%.

Thus, epitaxial (001) oriented Ir films have been grown on vicinal a-plane sapphire surfaces by electron-beam evaporation. The epitaxial relationship is Ir(100)//$Al_2O_3$ (11-20), with [011]Ir//[1-100]$Al_2O_3$ and [011]Ir//[0001]$Al_2O_3$. There is a minimum Ir deposition temperature, below which a (111) Ir texture develops. A 300 nm thick Ir film yielded a rocking curve linewidth of 0.21°, which shows high crystalline quality. We have suggested a model in which strain is sufficiently small to allow stability of (100) Ir on the sapphire a-plane. Because $Al_2O_3$ possesses excellent interfacial stability in a hydrogen plasma and has high crystalline perfection, it is likely to provide a superior substrate to MgO and $SrTiO_3$. Since the Ir/sapphire system has been shown to produce good heteroepitaxial (001) diamond on a scale of mm, these results suggest that wafer-scale growth of heteroepitaxial diamond should be practicable in the near future.

A series of Examples of nucleation and growth of CVD diamond grown on epitaxial Ir. The oxide substrates utilized for Ir growth were predominantly $SrTiO_3$ and $Al_2O_3$, although MgO and $LaAlO_3$ were also studied. Care was taken in the preparation and characterization of the low-index substrate surfaces. The nucleation process was optimized to produce high densities, of order $10^{12}$ $cm^{-2}$ across the Ir surface, irrespective of the underlying oxide substrate. The resulting (001) single crystal diamond films exhibited homogeneity on a scale of mm.

EXAMPLE 2

Substrates and Ir Growth

All experiments were carried out on 5×5×0.5 $mm^3$ substrates obtained from commercial sources. The (001) $SrTiO_3$ plates were typically cleaned in buffered HF before insertion into a UHV electron-beam evaporator. After in situ annealing for 20 to 120 minutes at 800° C., Ir was deposited at 2.4 nm/minute to a thickness of 150 or 300 nm. No post-deposition annealing was used as it tended to degrade the (001) epitaxial Ir. surface reactions of $SrTiO_3$ with stainless steel substrate holders were observed. Reduction of the oxide, as evidenced by its darkening, led to a finite electrical conductance across the substrate. Similar behavior was noted for $LaAlO_3$ but not for MgO.

Ir growth on polished (11-20) sapphire, or A-plane α-$Al_2O_3$ oriented approximately 1° of the a-direction was explored. Substrate preparation consisted of annealing in air at 1450° C. for 15 hr followed by a light solvent cleaning. The process resulted in atomically flat surfaces, with terraces extending for several μm. Ir was deposited at 800° C. under the UHV conditions noted above. The resulting Ir films were epitaxial with orientation Ir(001)∥$Al_2O_3$ (11-20) and Ir[110] ∥$Al_2O_3$[1-100] (Vargas, T., et al., Appl. Phys. Lett. 65 1094

Figure 5:
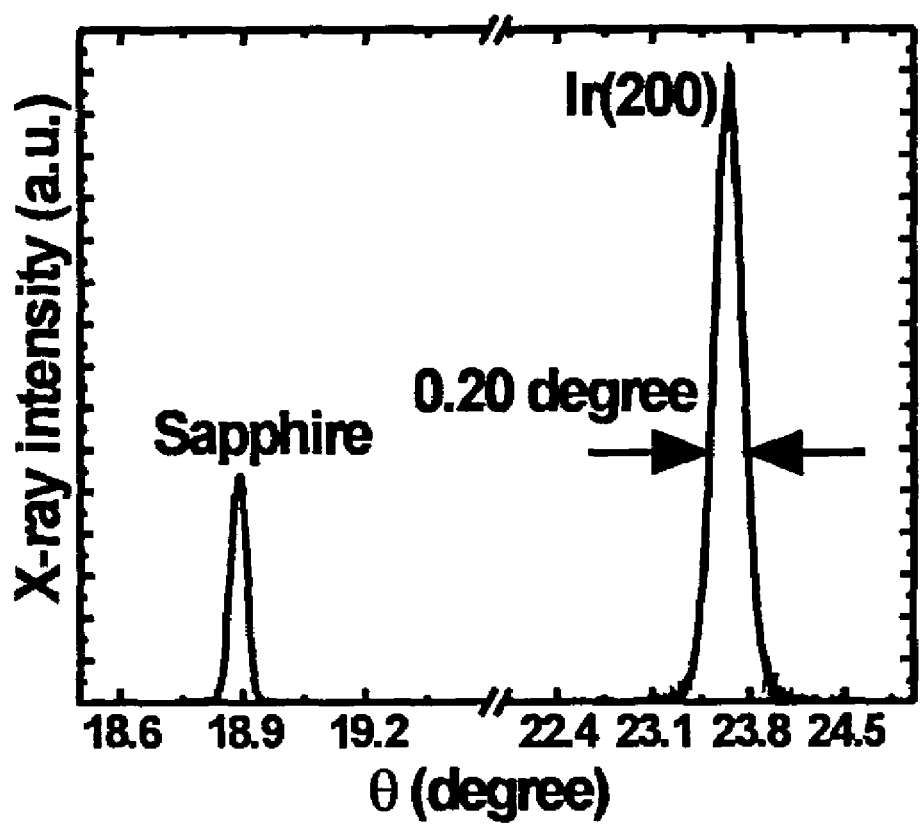
FIG. 5 shows x-ray diffraction rocking curves for 300 nm epitaxial iridium grown on a-plane sapphire. Linewidths (in deg): sapphire, 0.04; iridium, 0.21.

(1994)). FIG. 5 shows a X-ray diffraction rocking curve for a 300 nm Ir film, confirming the (001) orientation. It was found that this orientation is stable only if deposited above a threshold substrate temperature near 900° C. The X-ray line broadening of Ir on A-plane sapphire is comparable to Ir on $SrTiO_3$ (Schreck, M., et al., Appl. Phys. Lett. 74 650 (1999)). However, the stability of sapphire appears to be higher as no chemical reactions or darkening are observed.

Nucleation of Diamond on Ir(001)

Following Ir evaporation, the samples were transferred to a CVD chamber with a base pressure of $10^{-1}$ Torr. The apparatus 10 (FIG. 9B)(2.45 GHZ, 6 kW max) contained a quartz dome (Kuo, K. P., et al., Diamond and Related Materials 6 1097 (1997)) to confine the plasma to a central region in close proximity to the Mo sample holder 21. The tungsten bias ring 20 was mounted on posts between 16 and 32 mm above an electrically isolated sample stage 14. A typical process was initiated by a pure hydrogen plasma, followed by the addition of $CH_4$ after 5 min, at a 2% methane/hydrogen ratio. Pressure was 18 Torr, with flow rates 6 sccm and 300 sccm for $CH_4$ and $H_2$, respectively, at 700 W microwave power. No nitrogen gas was added intentionally. A bias potential of −140 to −200V was applied to the substrate 17 min after starting the process. By interrupting the procedure at times varying from 20 to 180 minutes, it was determined that uniform coverage of the substrate with carbon occurred approximately 60 minutes from the start of biasing. All results for heteroepitaxial diamond described here used a 60 min bias duration. The temperature during bias was about 700° C., as measured by an optical pyrometer focused on the Ir surface. As noted by others, it was found that the presence of a bright, second plasma 13 above the sample on holder 21 was a necessary condition for achieving efficient nucleation.(Kulisch, W., et al., Physica Status Solidi A 154 155 (1996); Stöckel, et al., J. Appl. Phys. 79 768 (1996); and Whitfield, M. D., et al., Diamond and Related Materials 9 305 (2000)).

Figure 7:
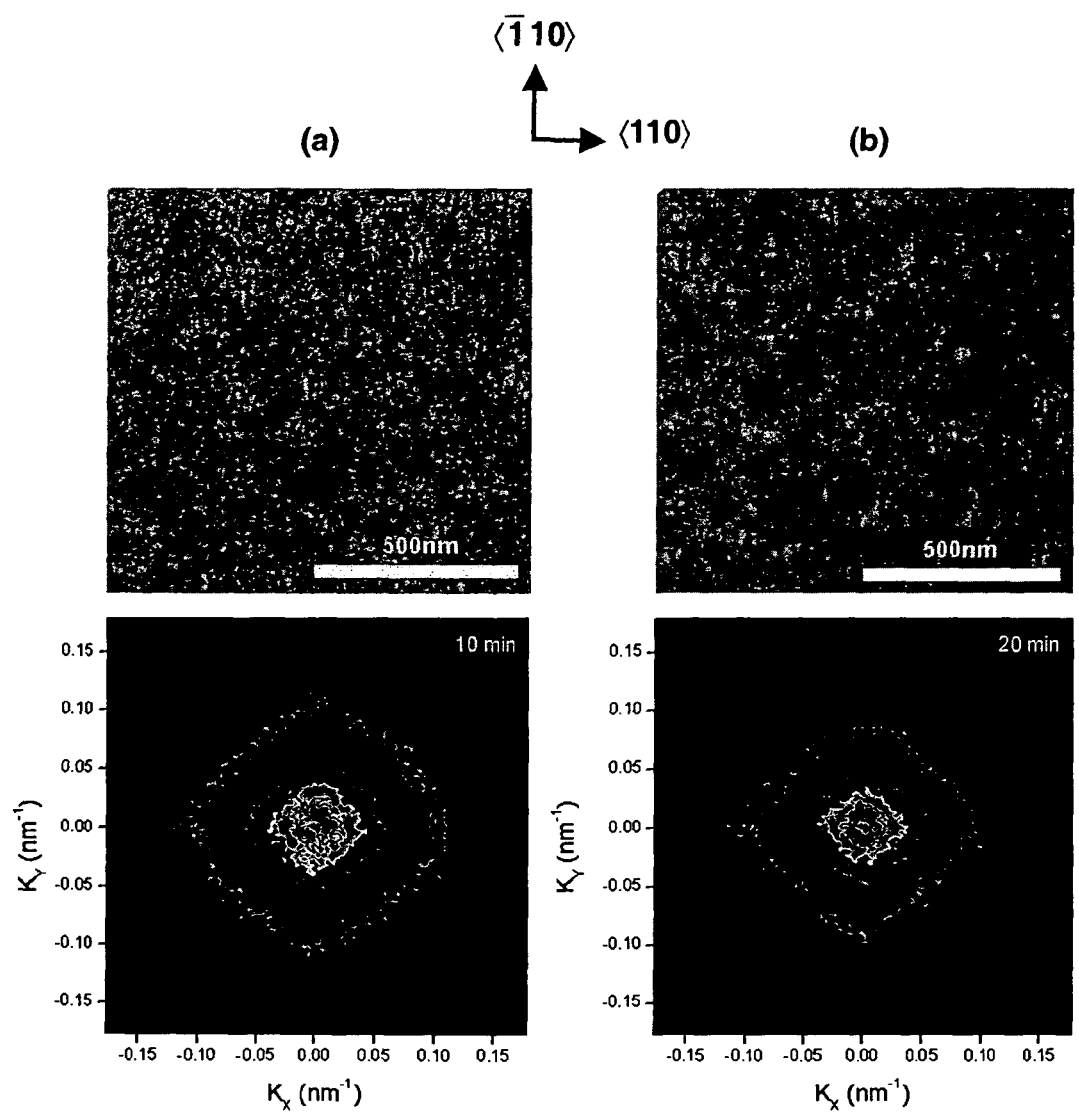
FIGS. 7A and 7B show SEM images of heteroepitaxial diamond growth on Ir(001)/SrTiO$_3$ for two time intervals after nucleation: (a) 10 min; (b) 20 min. Upper panels
FIGS. 7C and 7D: 2-D Fourier transforms of the binarized real-space images. The monotonic logarithmic contours are maximum at k=0. The Fourier transforms reveal the anisotropic distribution of crystallite interfaces, aligned along Ir[110] directions. The Ir surface is covered with diamond after 10 min growth (a). Appreciable coalescence occurs by 20 min (b), as seen by the contraction of the Fourier transform in FIG. 7D.

To estimate nucleation density, the bias process was interrupted by terminating the microwave power, leading to rapid quenching of the sample. Examination by SEM revealed regions of high electron emissivity that were interpreted to be diamond crystallites or nuclei at an early growth stage. FIG. 7B shows a result for an Ir/sapphire substrate (in reverse contrast for clarity. There is a uniform distribution of crystallite (nuclei) sizes with mean linear dimensions 5–10 nm and areal density of at least $5 \times 10^{11}$ $cm^{-2}$. This is a lower bound on nucleation density since some coalescence has already occurred. Furthermore, the distribution, although random, is not far from a close-packed array. This suggests that the distribution results from "interactions" among nuclei. The liquid-like array leads us to infer that nucleation does not need to occur at special topographic features of the substrate. Careful examination by SEM also reveals that some crystallite shapes, even at this early stage, are faceted with [110] lateral faces. The uniform distribution of crystallite sizes across the entire surface of the substrate strongly suggests that nucleation begins synchronously with the cessation of bias current.

Short-Time Growth and Coalescence of Diamond on Ir(001)

Figure 11:
FIG. 11 shows nucleation of diamond on Ir/STO. The bright spots are small crystallites of diamond that nucleate immediately after the cessation of bias treatment. The crystallites have extremely high density, $5 \times 10^{11}$ cm$^{-2}$, and all have the same crystallographic orientation. The <001> direction is out of the plane.
Figure 12:
FIG. 12 shows a diamond film on Ir/STO: 1 hr growth. Scanning electron microscope image of the surface of diamond after 1 hour of growth on STO. The film is about 0.2 μm thick. The bright spots are small protrusions on the surface that become charged in the electron microscope. Note the complete coalescence of grains to form a continuous film.
Figures 13A, 13B:
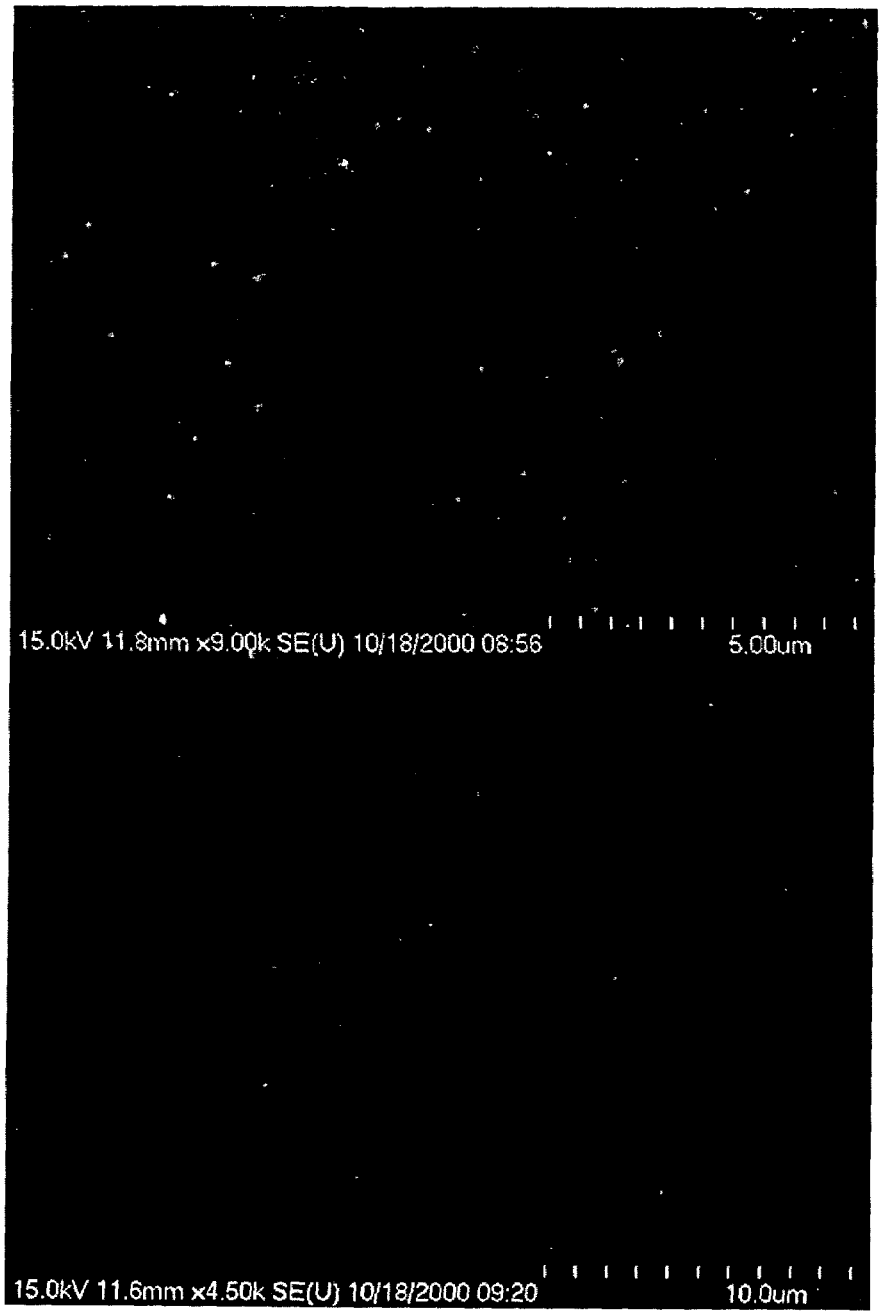
FIG. 13 shows diamond on Ir/STO: 3 hr growth. Scanning electron microscope image of the surface of diamond after 3 hours of growth on STO. The film is about 2 μm thick. The panel (FIG. 13A) shows a region in the center of the film. The lower panel (FIG. 13B) shows a region on the periphery of the film. The diamond at the edges is almost perfectly coalesced, with only a few interfaces visible.
Figure 14A:
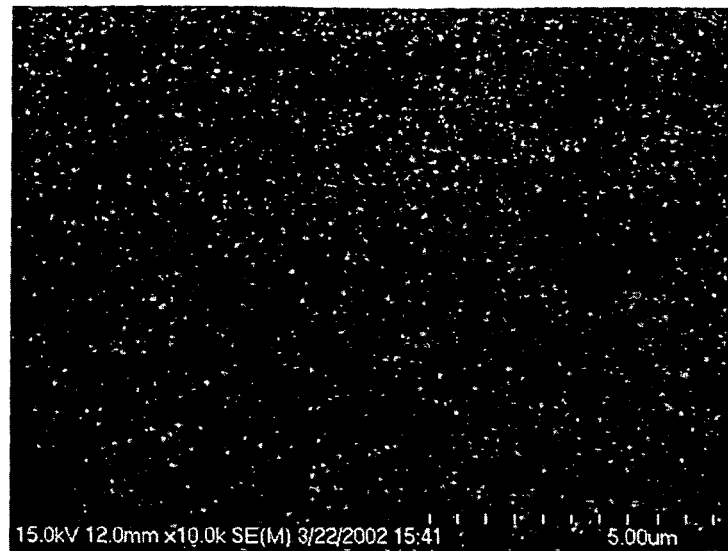
FIGS. 14A, 14B and 14C show diamond on Ir/STO: role of misorientation of STO from (001) direction. Diamond on STO with different miscut angles from the (001) plane showing the improvement in diamond quality as the miscut angle is reduced from 7 deg (top), to 1 deg (center), and to 0.5 deg (bottom).
Figure 14B:
Figure 14C:
Figure 16:
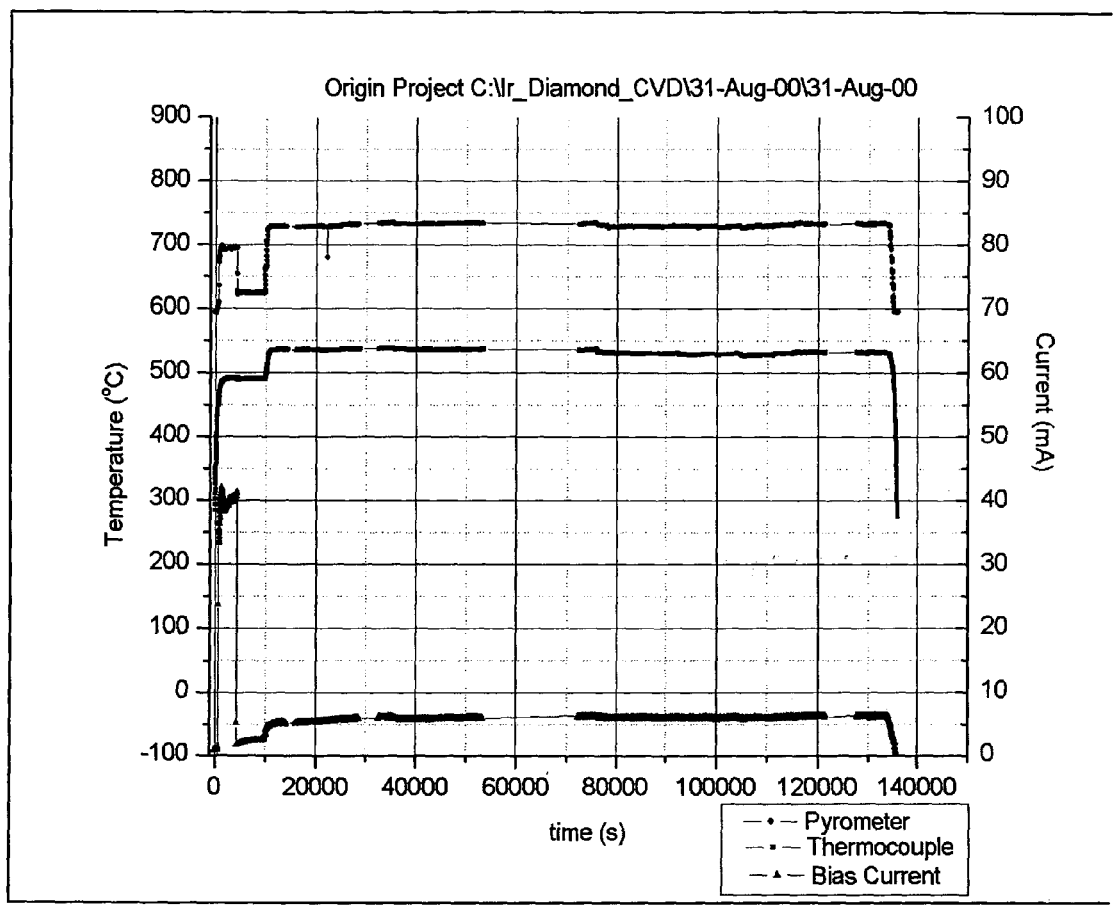
FIG. 16 shows a second spreadsheet entry for the STO/Ir/diamond growth experiment of FIG. 15. The graph shows the time-dependent temperature and bias current.
Figure 17:
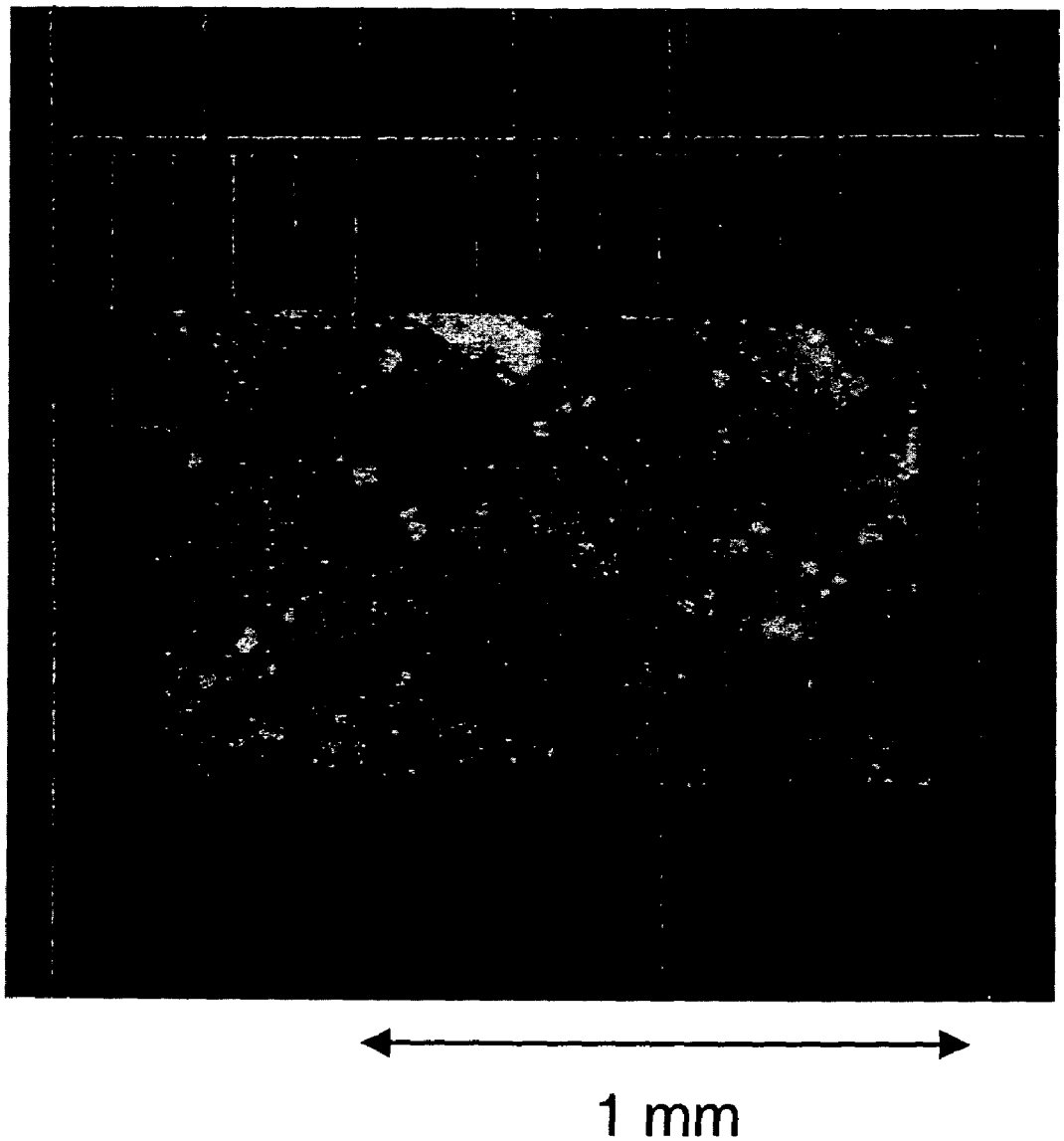
FIG. 17 shows diamond on Ir/STO: 48 hr growth showing transparent 38 μm slab. The slab was detached from the substrate, 0.04 μm thick, (111)<011> cleavage with a low defect density.
Figures 18A, 18B:
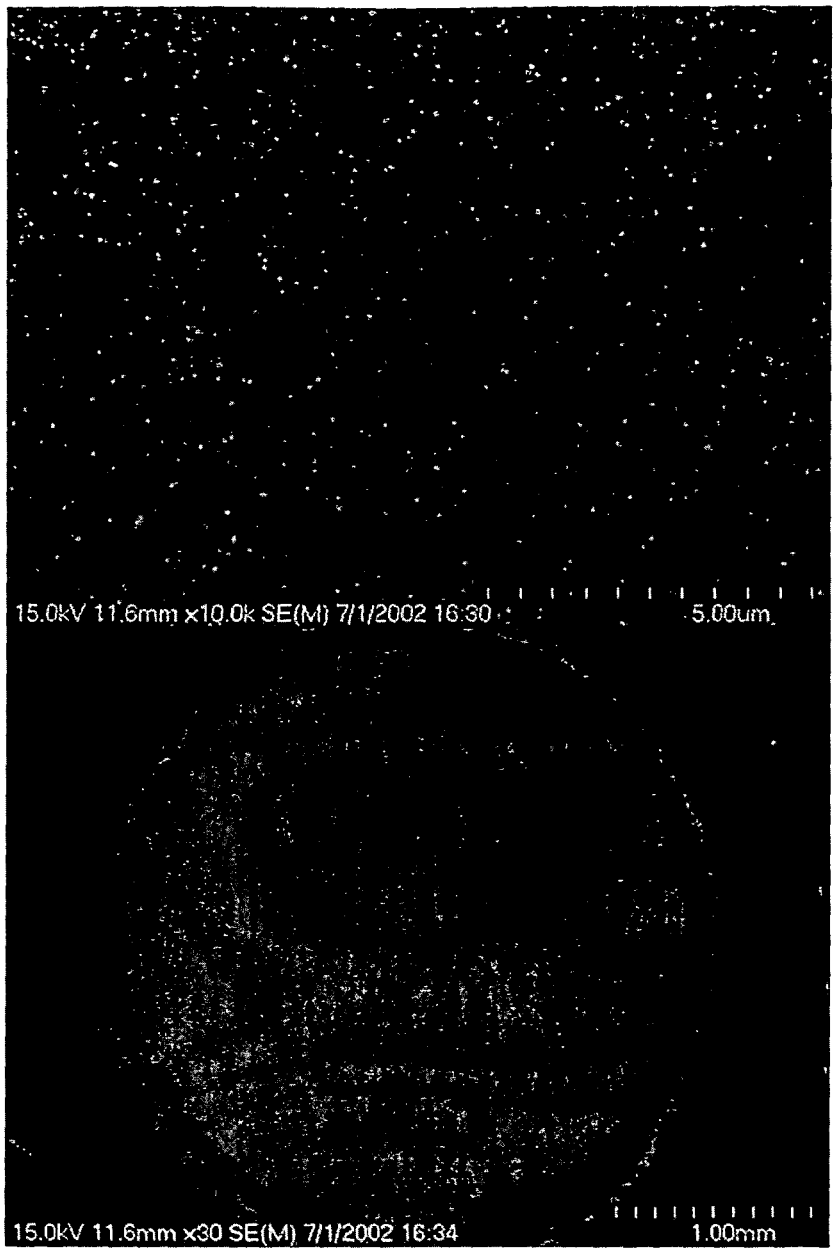
FIGS. 18A and 18B show diamond on Ir/ALO: 1 hour growth. Upper panel (FIG. 18A): 1 hr growth of diamond on Ir on A-plane sapphire showing completely coalesced film and smooth surface. Lower panel (FIG. 18B): overall view of entire diamond sample showing 3.5 mm diameter uniform coverage of square substrate (edge at right). The small spot in the lower right corner arose from a small irregularity in the surroundings.
Figure 19A:
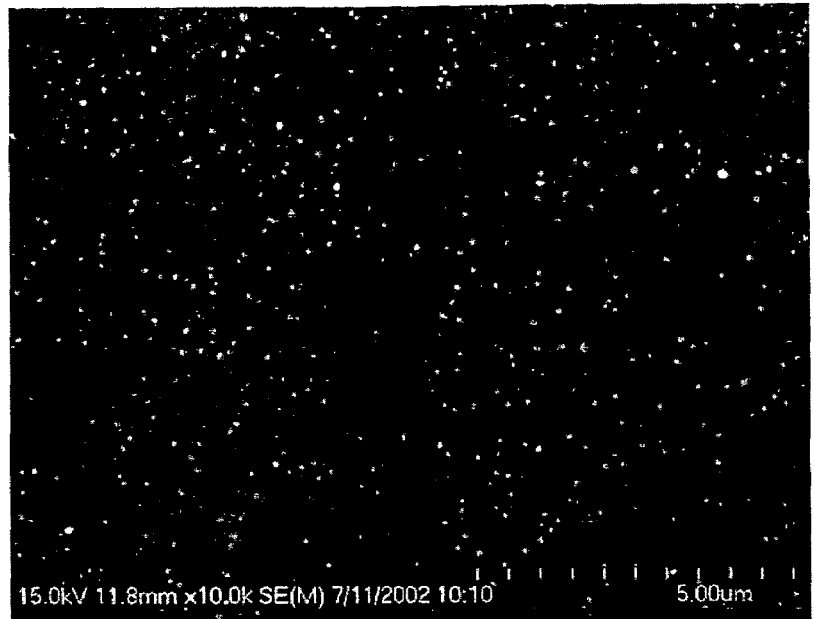
FIG. 19 shows diamond on Ir/ALO: 3 hr growth. Upper panel (center)(FIG. 19A): 3 hr growth of diamond on Ir on A-plane sapphire showing completely coalesced film and smooth surface. Lower panel (edge)(FIG. 19B). 3 hr growth of diamond on Ir on A-plane sapphire showing slightly less perfect coalescence.
Figure 19B:
Figure 21:
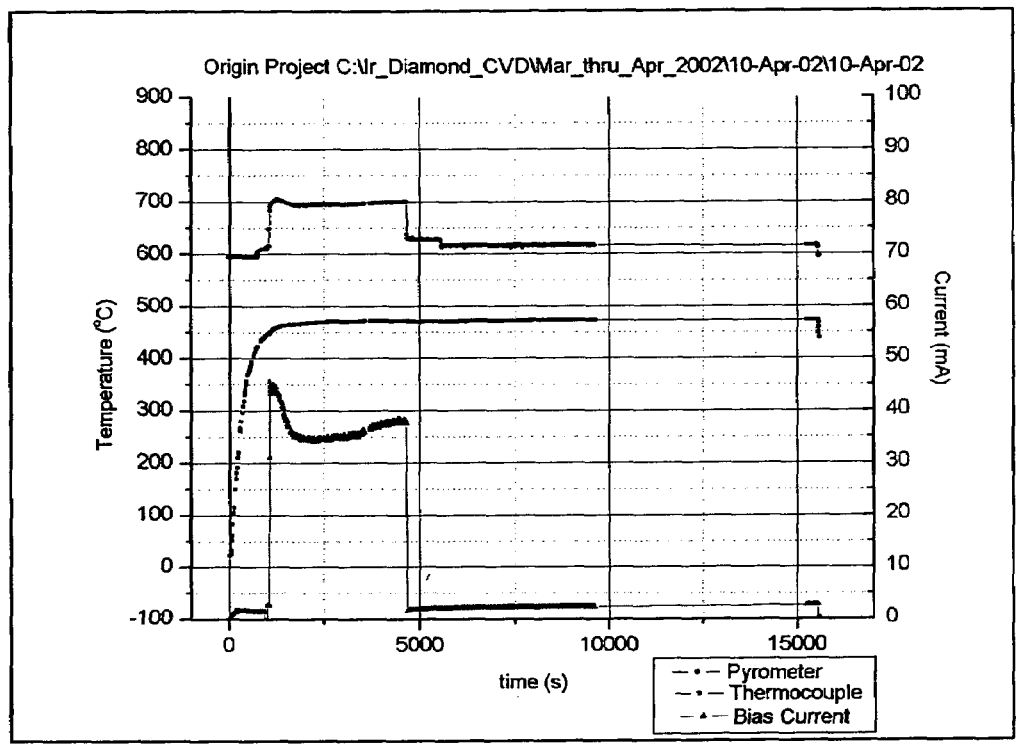
FIG. 21 shows spreadsheet entry for ALO/Ir/diamond growth experiment.

At a later stage of growth, the crystallites coalesce to form a continuous thin film. Studies of coalescence were carried out by interrupting growth at intervals from a few seconds to 30 minutes following cessation of biasing. The $CH_4/H_2$ ratio was decreased to 1% following biasing for the following interrupted growth experiments. FIG. 11 shows SEM images of diamond grown on Ir(001)/$SrTiO_3$ for intervals of 10 and 20 min subsequent to nucleation. They show a surface with a nearly continuous layer of diamond that is penetrated by a network of dark regions composed either of voids or of non-diamond carbon. The dark network is not random but has a structure readily revealed in 2-D Fourier transforms of the images. Since appreciable coalescence has taken place even after 10 min growth, the Fourier transform shows that the network has square anisotropy. Furthermore, the boundaries are predominantly aligned along [110] directions, as expected for (001)-oriented cubo-octahedral diamond crystallites. Thus, coalescence must occur by the annihilation of these interfaces, as observed in FIG. 7B. After 20 min, it is clear that the microstructure has coarsened, with appreciably fewer boundaries. This process is reflected by the contraction in reciprocal space of the Fourier transformed image. Square anisotropy is still present but their average grain size, or distance between interfaces has now increased to ~100 nm.

Figure 8:
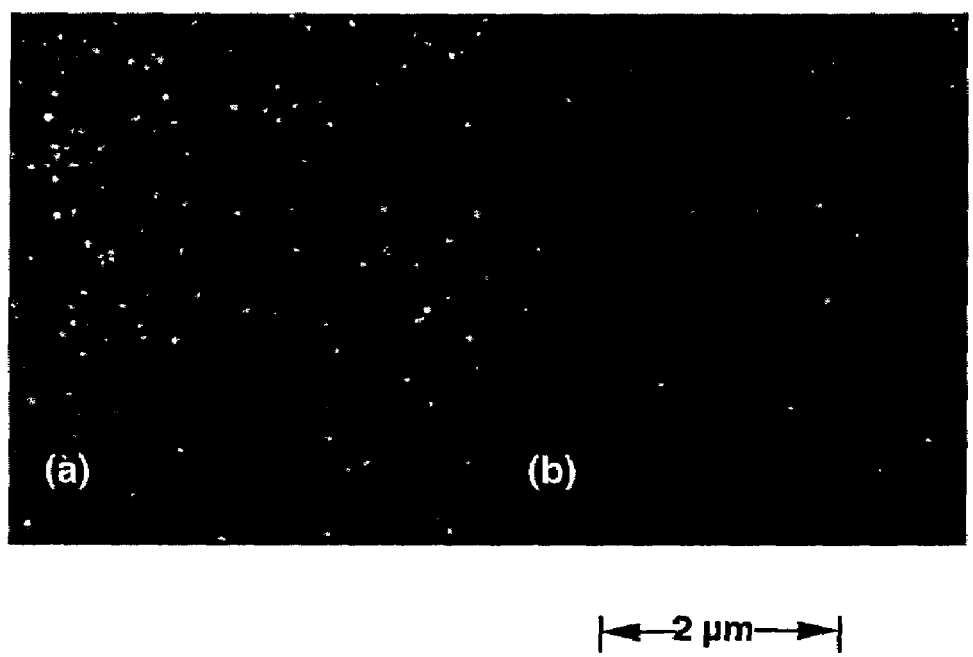
FIGS. 8A and 8B show scanning electron microscope images of the (001) surface of heteroepitaxial diamond on (001)Ir(001)SrTiO$_3$ after 60 minutes growth.

For a growth time of 60 min, the film is continuous, with thickness 0.7 μm. The surface shows little evidence of the voids or grain boundaries apparent at shorter times. SEM images of the diamond surface are shown in FIGS. 8A and 8B, for a region near the center of the film and for a region at its outermost periphery. The surface is quite smooth with the exception of small features that appear as bright spots. Their average height is a few nm as measured by AFM and are most noticeable on fully coalesced surfaces. It is believed that they arise from charging and enhanced emission from slight protrusions on the surface. This is most pronounced when the diamond is highly insulating without low impedance grain boundaries that act as current shunts to the substrate.

Films grown for 60 minutes have been extensively characterized by X-ray diffraction rocking curves, azimuthal scans, and pole figures. Electron backscattering diffraction (EBSD) was used to develop pole figures over selected areas ~10 $μm^2$. In all cases, the results are fully consistent with the development of single crystal (001) diamond, with no evidence for misoriented or twinned regions.

Long-Time Growth of Diamond on Ir(001)

To explore the properties of thick diamond films, long growth periods were used, from 36 to 48 hours. Growth proceeds for 90 minutes with a $CH_4/H_2$ ratio of 1%. Then, the total gas pressure is raised to 28 Torr over a period of 30 minutes and the $CH_4/H_2$ ratio is decreased to 0.75%. Slabs of (001) diamond with thickness from 25 to 38 μm were successfully grown. The thickest crystals are transparent in visible light and cleave along [110] directions on (111) surfaces as observed for natural diamond. Polarized Raman spectroscopy shows that the crystals obey the election rules expected for light wavevectors parallel to [001] and [110] directions in backscattering geometry. Raman linewidths are typically 5–6 $cm^{-1}$, quite good for CVD diamond.

Figure 6:
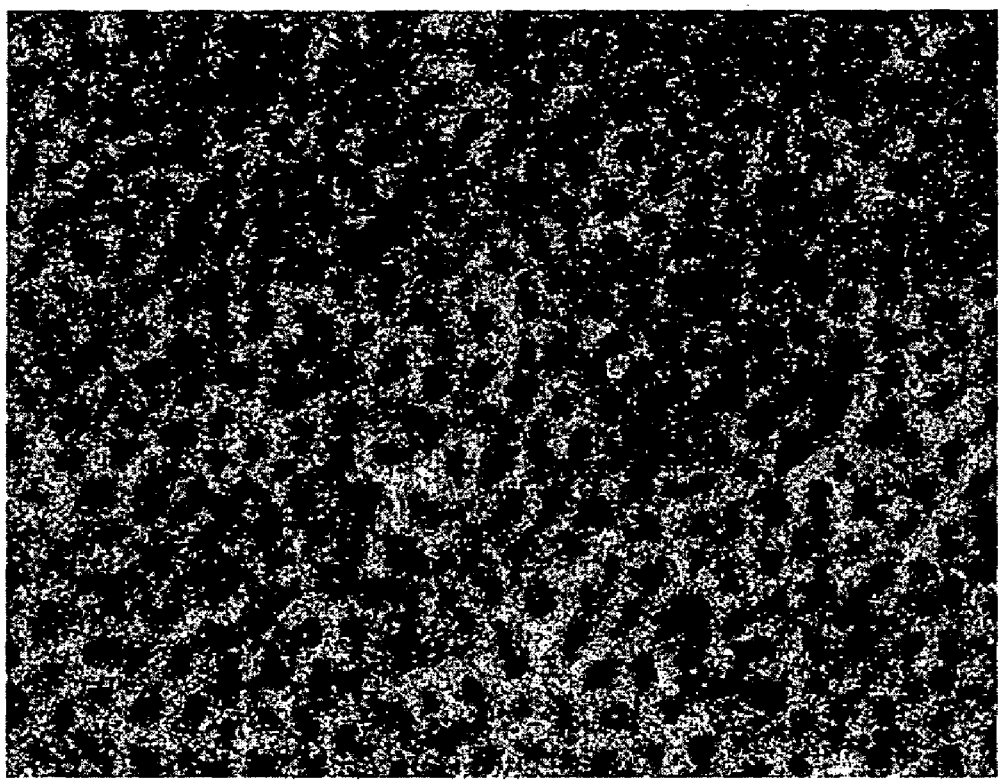
FIG. 6 is a scanning electron micrograph of the surface of a (001)Ir/a-plane sapphire substrate immediately subsequent to bias quenching. The dark objects are epitaxial diamond crystallites of average diameter 7 nm in an early stage of growth. (Reverse contrast image).

It has been shown that significant improvements in the heteroepitaxial growth of diamond using a (001) Ir buffer layer are possible. By optimizing CVD reactor geometry and the biasing process, nucleation densities of order $10^{12}$ $cm^{-2}$ have been inferred from quenching experiments. The uniform crystallite sizes provide compelling evidence that nucleation occurs synchronously with the termination of biasing. In the presence of a bias current the carbon condensate is in a highly excited, nonequilibrium state. Upon removal of the bias, the condensate cools rapidly, initiating nucleation. The liquid-like distribution of crystallites shown in FIG. 6 implies that correlations are induced among crystallites at a very early stage of growth. Early growth may be controlled by depletion of the carbon condensate deposited on the Ir surface during biasing. It is thus possible that there are much higher densities of nucleation sites initially, but competition for surface carbon amplifies growth of larger nuclei.

A higher density of nuclei leads to coalescence of grains at an earlier stage of the growth process. Continuous diamond film formation occurs after only a few minutes of growth. The subsequent films are more highly oriented since spatial correlations decay exponentially with distance and annihilation of interfacial defects is therefore more probable. However, for large area films, one must insure that the substrates are free of surface scratches, particulates, and pinholes that may compromise overall crystal quality.

The discovery that a-plane sapphire can be used to grow (001) diamond promises to lead to improvements in diamond heteroepitaxy. It has been observed that $SrTiO_3$ substrate quality is problematic, frequently exhibiting voids and macroscopic growth-included stress bands. At high temperatures it tends to react even with refractory metals and is readily reduced in vacuum. Sapphire, on the other hand, exhibits much greater mechanical and chemical stability at high temperatures and is available with remarkably good crystallographic quality. It is expected that this improved substrate system will enable the growth of wafer-scale heteroepitaxial diamond films in the near future.

EXAMPLE 3

Heteroepitaxial growth of Ir and Ir/diamond on STO (strontium titanate) and A-plane ALO (sapphire) are shown by FIGS. 5 to 23 as discussed above.

The growth of single crystalline diamond is by heteroepitaxy. Heteroepitaxy is the process of growing a monocrystalline thin or thick film material using as a template a substrate material with substantially the same lattice parameter (the spacing between atoms in the crystal). The process improvements and optimization resulting in diamond of higher crystalline quality, homogeneity, and size are in the following sequential steps:

1. Preparation of atomically flat (stepped) lattice-matched single crystal substrates by chemical, physical, and thermal methods. The substrates have surfaces terminated in specified lattice planes. Substrates investigated include sapphire ($Al_2O_3$), strontium titanate ($SrTiO_3$), lanthanum aluminate ($LaAlO_3$), and magnesium oxide (MgO).

2. Deposition of epitaxial iridium metal on the substrate by electron-beam evaporation in ultra-high vacuum at high temperature. In all cases the orientation of Ir is such that a (001) surface results.

3. Deposition of a carbon condensate on the Ir/oxide substrate by dc-biased low-energy ion bombardment in a microwave plasma-enhanced chemical vapor deposition reactor using methane and hydrogen gases. This is referred to in the literature as BEN, or bias-enhanced nucleation.

4. Growth of homogeneous thin films of single crystalline diamond up to about 2 μm thickness on the Ir/oxide substrate subsequent to turning off the dc discharge. This is carried out in a CVD reactor.

5. Growth of thick films of single crystalline diamond up to 38 μm thickness on the Ir/oxide substrate subsequent to turning off the dc discharge. The specific improved process steps are:

1. Use of atomically flat vicinal substrates, which can be shown to improve the diamond structural quality and smoothness.

2. First successful use of sapphire and $LaAlO_3$ as substrates for epitaxial Ir and diamond growth.

3. Ability to nucleate diamond on Ir with very high density which leads to higher diamond quality. This results from:
   a. Improvements in the geometry for ion bombardment, including: method for focusing the ion beam onto the substrate using an insulating shield (silicon mask 19); development of a diamond-coated metallic Mo cap 21 to promote uniform deposition across a substrate; and the arrangement of a bias ring as an electron return in the plasma.
   b. Additional process improvements associated with the reactor gas mixture composition, bias voltage, and temperature of the substrate preceding and during nucleation.

One tangible result of these process improvements has been the growth of diamond single crystals several mm on a side. The crystals are transparent at the maximum thickness grown (38 μm). They are freestanding since they detach from the substrate upon cooling to room temperature. The crystals exhibit cleavage surfaces identical to natural occurring diamond. To date, the largest crystal had an initial mass (before cleaving) approaching 0.1 carat.

Of particular significance is the first successful demonstration, to the inventors' knowledge, that (001) CVD diamond can be grown heteroepitaxially on sapphire. Sapphire substrates can be obtained commercially in large diameter (up to 10 inch) with high crystalline quality, is mechanically stronger than other substrates used for diamond growth, and is considerably more resistant to degradation at diamond growth temperatures. These features suggest the feasibility of growing very large area single-crystal diamond coated surfaces.

The results are supported by extensive characterization of the resultant films by: scanning electron microscopy, x-ray diffraction (including pole-figure and area scans in reciprocal space), electron beam scattering diffraction, microraman spectroscopy, and infra-red vibrational spectroscopy.

A number of process steps must be implemented simultaneously to grow large area films with high crystalline perfection. As in many processes, simultaneous execution of a multitude of detailed steps must occur to achieve successful heteroepitaxy. The net result of the process is the simultaneous nucleation of a high density of diamond nuclei, which subsequently grow and coalesce into a continuous diamond film. The high density of oriented nuclei is a result of several factors:

1. Choice of substrate, typically a crystalline oxide with a relatively close match of lattice parameter to diamond; choice of lattice plane.

2. Preparation of the substrate: chemical, mechanical, and thermal processing to achieve an atomically flat surface.

3. Misorientation of substrate from nominal lattice plane (vicinal surface).

4. Growth of epitaxial metal film, Ir(100), on oxide substrate.

5. Process for inducing diamond nucleation on Ir surface; BEN (bias-enhanced nucleation). Variables include:
   a. Microwave power.
   b. Gas composition and flow rate.
   c. Position of bias ring in plasma.
   d. Composition and thickness of refractory metal sample holder ring 15.
   e. Focusing geometry for bias current.
   f. Electrical isolation of sample holder 21 from reactor components.

g. Geometry of sample holder, chemical composition of sample holder.

h. Location of sample holder and sample from plasma ball.

i. Method of electrically contacting sample.

j. Conductance of substrate at bias temperature.

k. Temperature of sample during bias process.

l. Magnitude of sample voltage bias with respect to the plasma.

m. Bias current density.

n. Duration of bias.

6. Growth process for diamond films up to a thickness of 2 µm.

7. Growth process for diamond films above a thickness of 12 µm.

Characterization of substrates and diamond films have been made using:

1. Scanning electron microscopy (SEM). Resolution is better than 2 nm.

2. Atomic force microscopy (AFM). This yields maps of surface topography with lateral resolution of 5 nm and height variation of 0.1 nm.

3. Optical microscopy for features larger than a few µm.

4. X-ray diffraction linewidths to measure angular distributions of crystallites.

5. Electron back-scattered diffraction (EBSD) to measure the local orientation of the film at a resolution of a few 1 µm.

6. Micro-Raman scattering to confirm crystallinity by selection rules and to obtain linewidths as a function of depth and lateral position with a resolution of 1 µm.

7. Infrared absorption spectroscopy to detect hydrogen concentrations in thick crystals.

The following section elaborates on the choice of several process variables. In most cases, sufficient variation in the parameters has been explored so that an explanation for their magnitude can be afforded.

Initial experiments of heteroepitaxial diamond growth utilized MgO (001) substrates with Ir(001) grown epitaxially (Ohtsuka et al, 1996). Both have lattice parameters approximately 7% greater than diamond. Since MgO surfaces are typically prepared by cleaving, cleavage steps result in a relatively rough surface. Subsequently, by substituting $SrTiO_3$ (STO) for MgO, somewhat better films were obtained (Schreck et al, 1999). However, their best films showed incomplete coalescence of grains away from the geometric center of the substrate. Since it is believed to be a consequence of the nonuniform nucleation density, the present invention increases the overall density and removes the nonuniformity.

Bias Current Density Enhancement. This is accomplished by utilizing the microwave plasma enhanced CVD system of FIG. 9A which creates a large plasma ball relative to the substrate system. When a negative voltage is applied to the substrate system, positive ions are attracted to it. Since the large diameter of the substrate holder (75 mm) relative to the exposed sample diameter (3 mm) will result in a low current density, an insulating shield (silicon mask 19) was developed that surrounds the sample. This is built from single crystal silicon wafer machined by spark erosion into an annular cylinder. Small holes near the periphery of the wafer allow ceramic alumina standoffs to isolate the silicon from the stainless steel supporting plate or stage 14. The effect of the shield is to confine the bias current to the central region of the sample holder and sample which is in contact with the supporting plate at the bias potential. This increases the current density by 1 to 2 orders of magnitude with a proportionate increase in nucleation density.

Nucleation Density and Enhancement Method. The sample was exposed to the plasma by supporting it on a cylindrical base machined from molybdenum. Nucleation is sparse in this case. However, when a cylindrical ring of Mo forms an annular cap over the substrate, nucleation is enhanced. Furthermore, when the Mo cap acquires a thick coating of polycrystalline diamond, a large increase in nucleation density results.

The result of the diamond cap coating can be observed during the BEN process. A secondary plasma forms over the substrate system. The secondary plasma is believed to alter the local free radical concentrations and also leads to substantial heating of the substrate. After approximately 60 minutes, the bias is removed. The timing is important. The bias voltage is relatively low and no nitrogen is added to the gas mixture during biasing. The precise positioning of the substrate, and Mo cap, with respect to the plasma ball is quite important.

Figure 22:
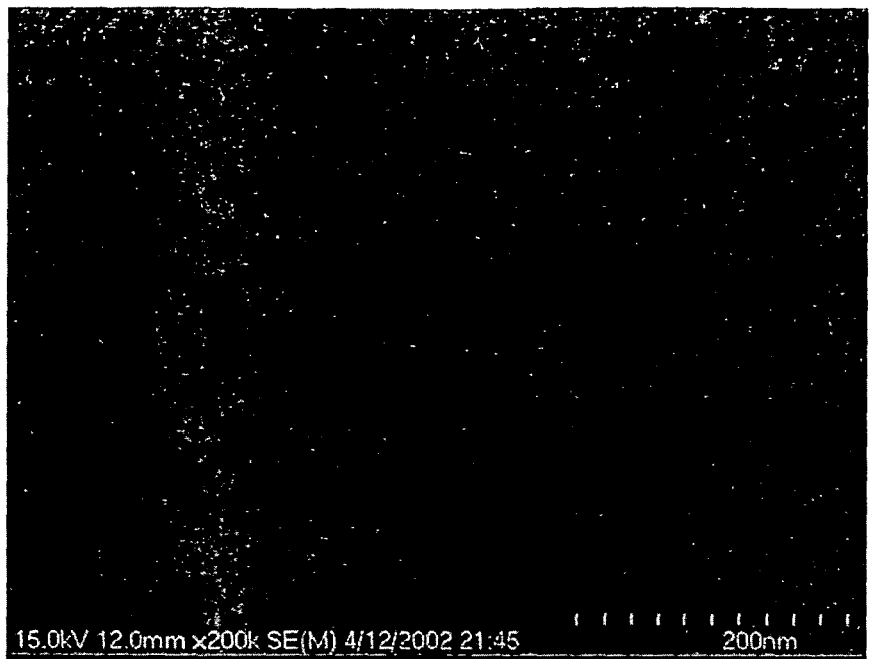
FIG. 22 shows an individual diamond nuclei on Ir (001)/a-$Al_2O_3$ after biasing.
Figure 23:
FIG. 23 shows a plan view of diamond thin film (bright region) on Ir(001)/STO.

The nucleation density is measured by terminating the plasma immediately subsequent to the BEN process. The substrate reveals small nuclei, of order 10 nm diameter, with little coalescence at a density approaching $10^{12}$ cm$^{-2}$. A SEM micrograph is shown in FIG. 22.

A comprehensive series of experiments were carried out on Ir(001)/STRO(001) with the above BEN process. When the Mo cap was well coated with diamond, nearly perfect coverage of the exposed Ir surface with diamond was achieved. Evidence for incomplete coalescence was noted only within 100 µm of the outer diameter of the exposed substrate adjacent to the Mo cap, see FIG. 23 for a low magnification SEM image of the entire sample and substrate. Temperature, measured with an optical pyrometer aimed at the Mo cap, was typically 710-730° C. during biasing. During the subsequent growth of a thin film, the temperature dropped to near 665° C. This leads to a slow growth rate, near 0.2 µm per hour. However, interrupted growth studies have shown that completely coalesced films appear after 30 to 40 minutes of growth. The films are generally smooth with occasional small protuberances that appear in SEM micrographs as bright spots, see FIG. 12, for a diamond film growth of one hour. It is believed that these are the result of growth instabilities that may result from non-uniform electric fields that occur during biasing. The protuberances disappear for longer growth times.

Role of Substrate Processing and Orientation. With STO substrates, the role of intentionally miscut (vicinal) (001) surfaces was studied. A series of STO surfaces with vicinal angles from 6 to 0.1° were studied. The distance between terraces increases as the miscut angle decreases; consequently, the surface roughness also decreases. We have discovered that small miscut angles yield improved diamond films, as characterized by XRD rocking curves and by AFM surface roughness measurements.

It was noted that damage to the STO occurs in the CVD system if it is directly exposed to the plasma. This is a further rationale for surrounding the sample with a Mo cap. Also, exposure of STO to high vacuum during the Ir evaporation leads to oxygen loss, as evidenced by a blackening of the crystal. This also leads to a loss of the insulating properties of STO. This can be an advantage since the finite conductance of STO gives a return path for the bias current. However, it was found that most STO substrates are rather imperfect, as evidenced by a "basket-weave" texture when viewed under the optical microscope. This appears to be stress-induced striations, with deleterious effects on the Ir crystallographic perfection.

Growth on Novel Substrate: A-plane Sapphire. Alternate substrates for Ir growth were explored and it was discovered that single crystal sapphire ($Al_2O_3$) is a suitable substrate for diamond growth. Previous attempts to use sapphire as a diamond substrate have utilized its basal plane (0001) surface. This surface has hexagonal symmetry; consequently, diamond tends to grow along the <111> direction. Only limited success has been achieved, with small, poorly coalesced regions of diamond observed.

In contrast, there was success in growing Ir(001) on the A-plane, or (11-20), surface. Ir growth is carried out in a similar manner to growth on STO. However, stability of the Ir(001) habit occurs for substrate temperatures about 700° C. and may also depend on a minimal miscut angle. Sapphire is superior to STO as a diamond substrate by virtue of its greater hardness, higher melting point, better match to the thermal expansivity of diamond, higher thermal conductivity, high crystallographic perfection, and commercial availability of oriented substrates up to 10 inches diameter. It was shown that diamond can be grown on a-plane sapphire with perfection as high as on STO. The growth of diamond on sapphire can be expected to lead to processes for producing single crystal diamond substrates with areas much greater than any naturally occurring diamond stones at appreciably lower cost.

Diamond is useful in many fields involving electric or acoustic fields. Particular applications for large area diamond substrates are:

1. Substrates for further homoepitaxial growth of thick diamond plates.
2. Diamond windows for low-loss infrared and microwave transmission.
3. Deep (vacuum) UV photodetectors.
4. Detectors of energetic photons and particles based on creation of electron-hole pairs. The diamond nuclei can be useful in optoelectronic applications as point sources of light (i.e. quantum dots).

It is intended that the foregoing description be only illustrative of the present invention and that the present invention be limited only by the hereinafter appended claims.

We claim:

1. A process for producing heteroepitaxial growth of a single crystal diamond film which comprises:
   (a) forming an atomically flat stepped surface on a single crystal metal oxide substrate which has a crystal structure for depositing a film of epitaxial iridium to produce a (001) film on the surface;
   (b) depositing the film of the epitaxial iridium metal on the metal oxide so that the (001) surface results;
   (c) depositing by chemical vapor deposition (CVD) diamond nuclei onto the iridium film on the substrate, which is mounted on a holder for the substrate which holder has a negative bias and which holder comprises an insulating shield and a cap in the plasma, wherein the diamond nuclei emerge from a plasma produced from a mixture comprising methane and hydrogen gases with dc-biased ion bombardment onto the iridium film; and
   (d) growing the diamond film on the diamond nuclei condensate and iridium film using CVD and the mixture of the methane and the hydrogen, without the dc-biased ion bombardment to form the single crystal diamond.

2. The process of claim 1 wherein in step a) the metal oxide substrate is selected from the group consisting of sapphire, strontium titanate, lanthanum aluminate and magnesium oxide.

3. The process of claim 1 wherein in step a) the atomically flat surface is provided by chemical, mechanical or thermal means.

4. The process of claim 1 wherein the d.c. bias is between −100 and −300 volts relative to a bias ring located within the plasma above the substrate.

5. The process of any one of claim 1, 2, 3 or 4 wherein the microwave frequency is between 900 MHz and 2.5 GHz, the methane to hydrogen ratio is between 0.002 and 0.04, and the temperature is between about 650 and 850° C.

6. The process of any one of claim 1, 2, 3 or 4 wherein the gases are essentially free of nitrogen.

7. The process of claim 1 wherein the substrate is electrically isolated from a support during the CVD.

8. The process of claim 1 wherein the substrate is electrically isolated during the CVD.

9. A process for producing a composite composition which comprises:
   (a) forming atomically flat stepped surface on a single crystal metal oxide which has a crystal structure for depositing a film of epitaxial iridium to produce a (001) film on the surface;
   (b) depositing the film of epitaxial iridium metal on the metal oxide surface so that the (001) surface results; and
   (c) depositing diamond nuclei on the iridium film by chemical vapor deposition (CVD) from a plasma produced from a mixture comprising methane and hydrogen gases with dc-biased ion bombardment onto the iridium film on the substrate, which is mounted on a holder for the substrate which holder has a negative bias and which holder comprises an insulating shield and a cap in the plasma, from the gases to produce the composite composition.

10. The process of claim 8 wherein the substrate is sapphire.

11. The process of claim 10 wherein the dc bias is between −100 and −300 volts relative to a bias ring located in the plasma above the surface.

12. The process of any one of claim 8, 10 and 11 wherein the microwave frequency is between 900 MHz and 2.5 GHz, the methane to hydrogen rate is between 0.002 and 0.04 and the temperature is between 650 and 850° C.

13. The process of any one of claim 9, 11 or 8 wherein the gases are essentially free of nitrogen.

* * * * *

UNITED STATES PATENT AND TRADEMARK OFFICE
CERTIFICATE OF CORRECTION

PATENT NO. : 7,060,130 B2
APPLICATION NO. : 10/634908
DATED : June 13, 2006
INVENTOR(S) : Brage Golding, Connie Bednarski-Meinkeand and Zhong-ning Dai It is certified that error appears in the above-identified patent and that said Letters Patent is hereby corrected as shown below:

Column 16, line 46, "claim 8 wherein" should be --claim 9 wherein--.

Column 16, line 48, "claim 10 wherein" should be --claim 9 wherein--.

Column 16, line 52, "claim 8, 10, and" should be --claims 9, 10, and--.

Column 16, line 56, "claim 9, 11, or 8" should be --claims 9, 10, or 11--.

Signed and Sealed this

Third Day of April, 2007

JON W. DUDAS
*Director of the United States Patent and Trademark Office*